United States Patent
Kato et al.

(10) Patent No.: US 10,103,321 B2
(45) Date of Patent: Oct. 16, 2018

(54) MAGNETORESISTIVE ELEMENT AND MAGNETIC MEMORY

(71) Applicants: Kabushiki Kaisha Toshiba, Minato-ku (JP); Tohoku University, Sendai-shi (JP)

(72) Inventors: Yushi Kato, Chofu (JP); Tadaomi Daibou, Yokohama (JP); Qinli Ma, Sendai (JP); Atsushi Sugihara, Sendai (JP); Shigemi Mizukami, Sendai (JP); Terunobu Miyazaki, Sendai (JP)

(73) Assignees: KABUSHIKI KAISHA TOSHIBA, Minato-ku (JP); TOHOKU UNIVERSITY, Sendai-shi (JP)

( * ) Notice: Subject to any disclaimer, the term of this patent is extended or adjusted under 35 U.S.C. 154(b) by 0 days.

(21) Appl. No.: 15/259,525

(22) Filed: Sep. 8, 2016

(65) Prior Publication Data

US 2016/0380185 A1    Dec. 29, 2016

Related U.S. Application Data

(63) Continuation of application No. PCT/JP2015/053197, filed on Feb. 5, 2015.

(30) Foreign Application Priority Data

Mar. 13, 2014   (JP)  ................. 2014-050858

(51) Int. Cl.
*H01L 43/08*     (2006.01)
*H01L 43/10*     (2006.01)
(Continued)

(52) U.S. Cl.
CPC ............ *H01L 43/08* (2013.01); *G11C 11/161* (2013.01); *G11C 11/1673* (2013.01);
(Continued)

(58) Field of Classification Search
CPC ......... H01L 43/02; H01L 43/04; H01L 43/08; H01L 43/10; H01L 43/12
See application file for complete search history.

(56) References Cited

U.S. PATENT DOCUMENTS

| 8,520,433 B1 | 8/2013 | Kato et al. |
| 8,680,633 B1 | 3/2014 | Kato et al. |

(Continued)

FOREIGN PATENT DOCUMENTS

| JP | 2009-102703 A | 5/2009 |
| JP | 2010-219177 A | 9/2010 |

(Continued)

OTHER PUBLICATIONS

Translation of JP2013-197406.*

(Continued)

*Primary Examiner* — Cuong Q Nguyen
(74) *Attorney, Agent, or Firm* — Oblon, McClelland, Maier & Neustadt, L.L.P.

(57) ABSTRACT

A magnetoresistive element according to an embodiment includes: a first magnetic layer; a second magnetic layer; a first nonmagnetic layer disposed between the first magnetic layer and the second magnetic layer; and a third magnetic layer disposed between the first magnetic layer and the first nonmagnetic layer, the first magnetic layer containing Mn and at least one of Ge, Ga, or Al, and the third magnetic layer containing $Mn_2VZ$, where V represents vanadium, and Z represents at least one element of Al or Ga.

22 Claims, 21 Drawing Sheets

(51) Int. Cl.
*H01L 27/22* (2006.01)
*G11C 11/16* (2006.01)
*H01L 43/02* (2006.01)
*H01F 10/32* (2006.01)

(52) U.S. Cl.
CPC ...... *G11C 11/1675* (2013.01); *H01F 10/3295* (2013.01); *H01L 27/228* (2013.01); *H01L 43/02* (2013.01); *H01L 43/10* (2013.01); *H01F 10/3254* (2013.01); *H01F 10/3286* (2013.01)

(56) References Cited

U.S. PATENT DOCUMENTS

2004/0165320 A1* 8/2004 Carey .................. H01L 43/10 360/324.11
2012/0241881 A1* 9/2012 Daibou .................. H01L 43/10 257/421

FOREIGN PATENT DOCUMENTS

| | | |
|---|---|---|
| JP | 2012-204683 A | 10/2012 |
| JP | 2013-197406 A | 9/2013 |
| JP | 2014-63886 A | 4/2014 |

OTHER PUBLICATIONS

International Preliminary Report on Patentability and Written Opinion of the International Searching Authority dated Sep. 22, 2016 in PCT/JP2015/053197 filed Feb. 5, 2015 (submitting English translation).

International Search Report dated Apr. 21, 2015 in PCT/JP2015/053197.

S. Ikeda, et al., "Tunnel Magnetoresistance of 604% at 300 K by Suppression of Ta Diffusion in Co Fe B/Mg O/Co Fe B Pseudo-Spin-Valves Annealed at High Temperature" Applied Physics Letters, vol. 93, 2008, pp. 082508-1-082508-3 and cover page.

Zhenchao Wen, et al., "Magnetic Tunnel Junctions with Perpendicular Anisotropy Using a $Co_2$ FeAl Full-Heusler Alloy" Applied Physics Express 5, 2012, 063003-1-063003-3 and cover page.

Kubota, et al., "Element-Specific Evaluation of Magnetic Moments in Ferrimagnetic Mn2 VA1 Heusler Epitaxial Thin Films" Journal of the Magnetics Society of Japan, vol. 34, No. 2, 2010, pp. 100-106.

* cited by examiner

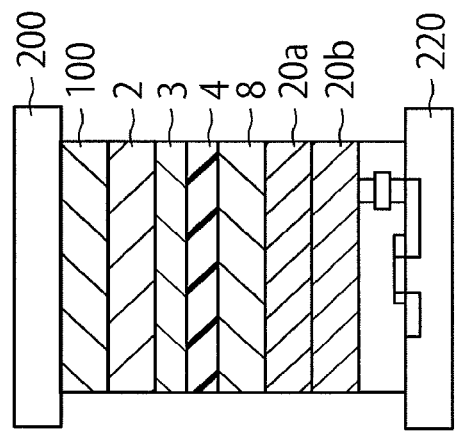
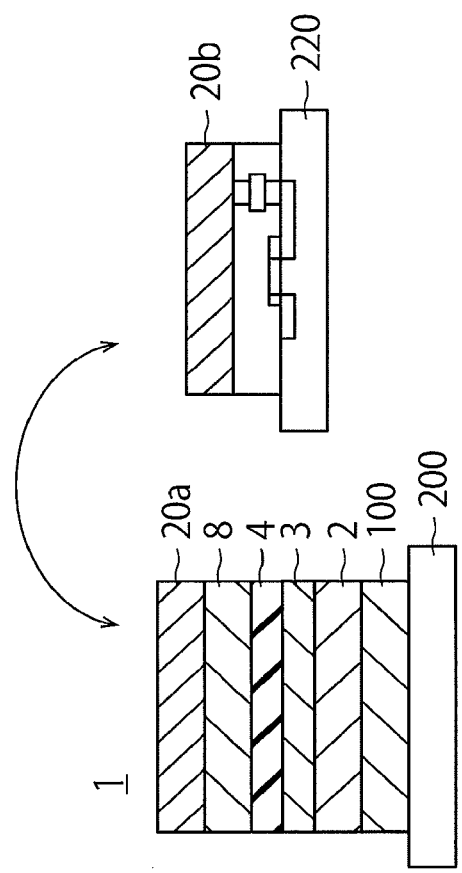
FIG. 15A
FIG. 15B

MAGNETORESISTIVE ELEMENT AND MAGNETIC MEMORY

CROSS REFERENCE TO RELATED APPLICATIONS

This application is a continuation of International Application No. PCT/JP2015/053197, filed on Feb. 5, 2015, which is based upon and claims the benefit of priority from the prior Japanese Patent Application No. 2014-050858, filed on Mar. 13, 2014, the entire contents of which are incorporated herein by reference.

FIELD

Embodiments described herein relate generally to magnetoresistive elements and magnetic memories.

BACKGROUND

Magnetic tunnel junction (MTJ) elements serving as magnetoresistive elements have a multilayer structure including a storage layer, in which the magnetization direction is changeable, a reference layer, in which the magnetization direction is fixed, and an insulating layer disposed between the storage layer and the reference layer. The MTJ elements are known to have a tunneling magnetoresistive (TMR) effect, and used as storage elements of memory cells in magnetic random access memories (MRAMs).

MRAMs store data ("1", "0") based on changes in relative angle between magnetization directions of magnetic layers included in each MTJ element, and are nonvolatile memories. Since the magnetization may be switched in several nanoseconds, data may be written and read at a high speed. Therefore, the MRAMs are highly expected as next-generation high-speed nonvolatile memories. The cell size of the MRAMs may be reduced by employing spin transfer torque magnetization switching, in which the magnetizations are controlled by means of spin polarized currents. The reduction in cell size may lead to an increase the current density. The increased current density may allow magnetization switching in storage layers to be performed more easily. Therefore, MRAMs with high density and low power consumption may be obtained.

In order to improve the density of nonvolatile memories, the magnetoresistive elements should be integrated more densely. However, thermal stability of ferromagnetic materials, which form magnetoresistive elements, may be degraded if the entire device size is reduced. Therefore, improvement in the magnetic anisotropy and the thermal stability of the ferromagnetic materials is a problem.

In order to solve this problem, attempts have recently been made to produce MRAMs including perpendicular magnetization MTJ elements, in which the magnetizations of the ferromagnetic materials are perpendicular to the film plane. The magnetic materials to form perpendicular magnetization MTJ elements need to have perpendicular magnetic anisotropy. In order to achieve the perpendicular magnetic anisotropy, materials having crystalline magnetic anisotropy or interface magnetic anisotropy are selected. For example, FePt, CoPt, and FePd have strong crystalline magnetic anisotropy. A number of MgO-based MTJ elements including MgO as a tunnel barrier, and ferromagnetic layers disposed with the MgO sandwiched therebetween and having interface perpendicular magnetic anisotropy, such as layers of CoFeB, are reported.

BRIEF DESCRIPTION OF THE DRAWINGS

FIGS. 15A and 15B are explanatory diagrams illustrating a method of manufacturing an MTJ element including a magnetic film having a monocrystalline structure.

DETAILED DESCRIPTION

Figure 1A:
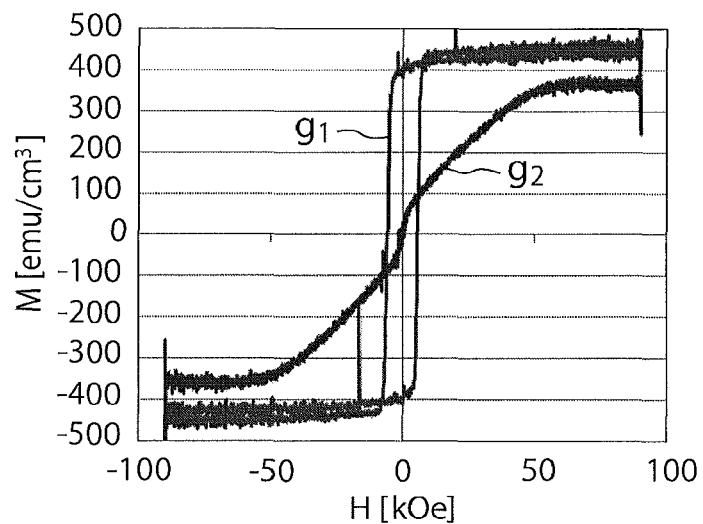
FIGS. 1A to 1D are diagrams showing examples of magnetization curves indicating the dependency of the magnetization on the thickness of a FeB layer in a FeB/MnGa multilayer structure.
Figure 1B:
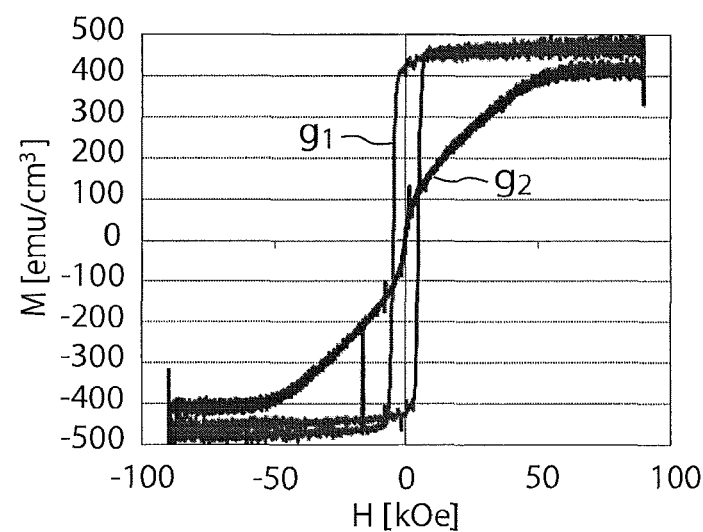
Figure 1C:
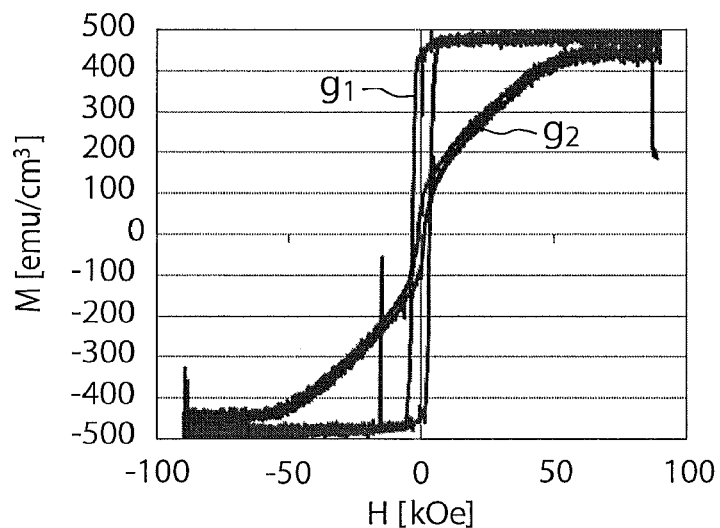
Figure 1D:
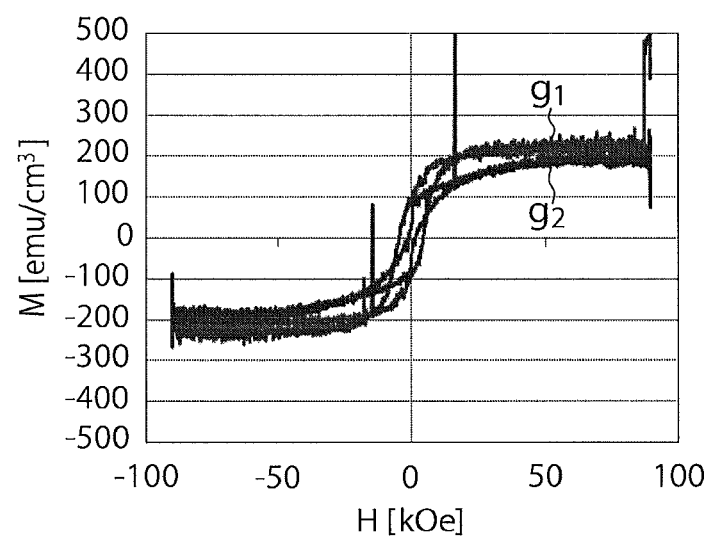

A magnetoresistive element according to an embodiment includes: a first magnetic layer; a second magnetic layer; a first nonmagnetic layer disposed between the first magnetic layer and the second magnetic layer; and a third magnetic layer disposed between the first magnetic layer and the first nonmagnetic layer, the first magnetic layer containing Mn and at least one of Ge, Ga, or Al, and the third magnetic layer containing $Mn_2VZ$, where V represents vanadium, and Z represents at least one element of Al or Ga.

Hereinafter, embodiments will be described with reference to the accompanying drawings. In the following descriptions, an element having the same function and the same structure as a previously described element is denoted by the same reference numeral as the previously described element, and a repeated description of such an element will be provided only when it is necessary to do so.

Before embodiments will be described, how the inventors have reached the embodiments will be described. In MRAMs employing spin transfer torque to switch magnetization, a critical current for switching magnetization by the spin transfer torque is dependent on the saturation magnetization and the Gilbert damping factor of the storage layer. Therefore, if the magnetization of the storage layer needs to be switched by the spin transfer torque of a low current, the saturation magnetization and the Gilbert damping factor of the storage layer should be reduced. The perpendicular magnetic anisotropy and the thermal stability of the storage layer should also be improved. The inventors produced a magnetoresistive element including a storage layer formed of a material with low saturation magnetization, low Gilbert damping factor, and high perpendicular magnetic anisotropy, and an interfacial layer of CoFeB having high spin polarization. The material of the storage layer will be described in detail later. As the study proceeded, however, a problem was found in obtaining high magnetoresistive ratio (MR ratio).

In a magnetoresistive element including a CoFeB interfacial magnetic layer, a high MR ratio may be obtained if the thickness of the interfacial layer is increased. For example, if a sufficiently thick CoFeB layer is used, the TMR ratio reaches as high as about 600% as described in Appl. Phys. Lett., 93 (2008) 082508). However, there is a problem in that an MTJ element including a sufficiently thick CoFeB layer is an in-plane MTJ element. A FeB/MnGa multilayer structure was produced to investigate the critical thickness of a perpendicular magnetization interfacial layer in a multilayer structure of CoFeB/crystalline magnetic material. The reason why FeB is selected instead of CoFeB is that FeB has greater perpendicular magnetic anisotropy. FIGS. 1A to 1D show examples of magnetization curves indicating the dependency of the magnetization on the thickness of the FeB layer in a FeB/MnGa multilayer structure. FIGS. 1A to 1D represent FeB layers with the thickness of 0 nm, 1.3 nm, 1.7 nm, and 1.9 nm, respectively. The magnetization curve $g_1$ of each drawing indicates a case where an external magnetic field is applied to the film plane in a perpendicular direction, and the magnetization curve $g_2$ indicates a case where an external magnetic field is applied to the film plane in an in-plane direction. As can be understood from FIG. 1D, if the thickness of the FeB layer is 1.9 nm, the characteristic of perpendicular magnetization film is considerably degraded and the characteristic of in-plane magnetization film appears. It can be understood from the foregoing that when a FeB layer is used as an interfacial magnetic layer, there is an upper limit in the thickness to maintain the characteristic of perpendicular magnetization film, which is about 1.7 nm. However, the FeB layer having a thickness less than the upper limit cannot obtain a high TMR ratio as is achieved in an in-plane MTJ element, in which the magnetization of a ferromagnetic material is in parallel to the film plane. There is also a problem of a low thermal stability.

Figure 2A:
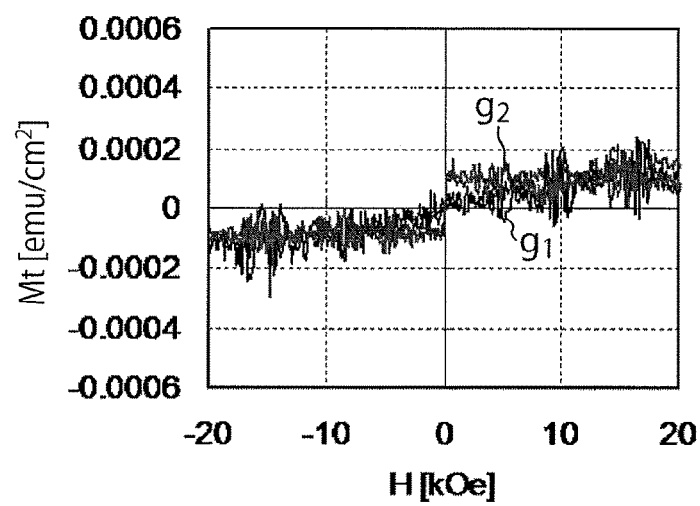
FIGS. 2A to 2C are diagrams showing examples of magnetization curves of $Co_2MnAl$ films.
Figure 2B:
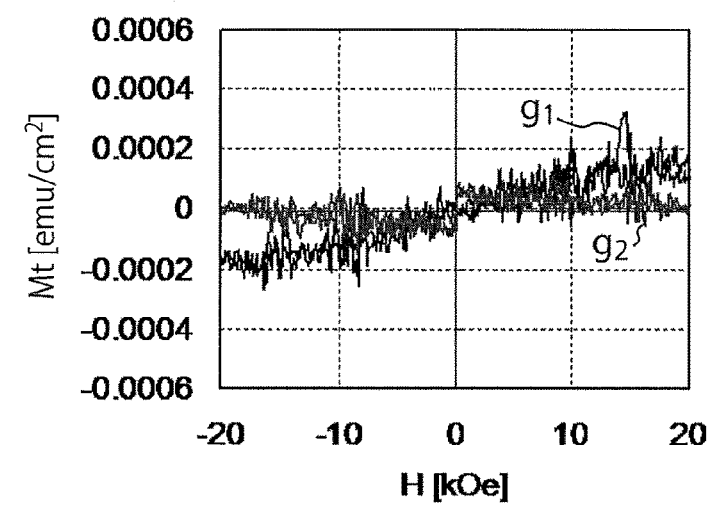
Figure 2C:
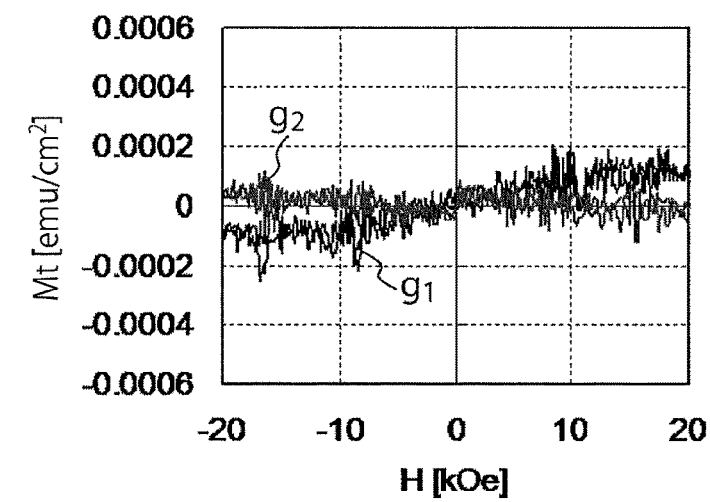
Figure 3A:
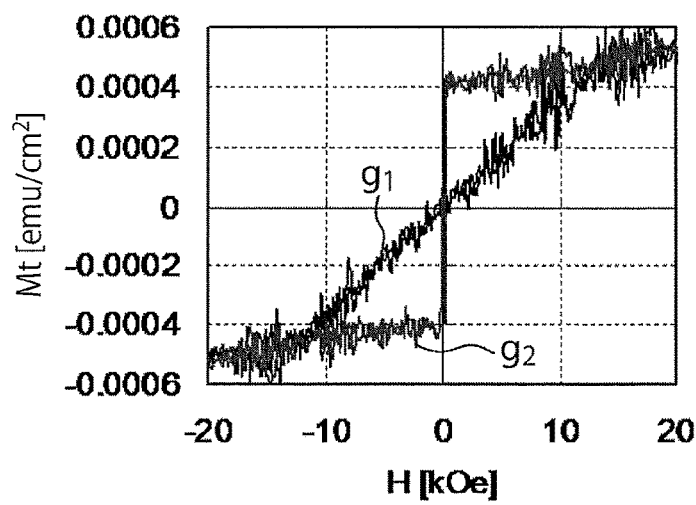
FIGS. 3A to 3C are diagrams showing examples of magnetization curves of $Co_2MnAl$ films.
Figure 3B:
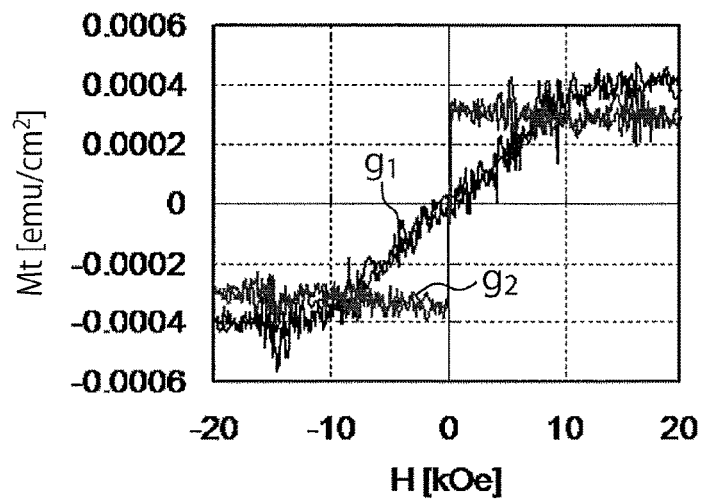
Figure 3C:
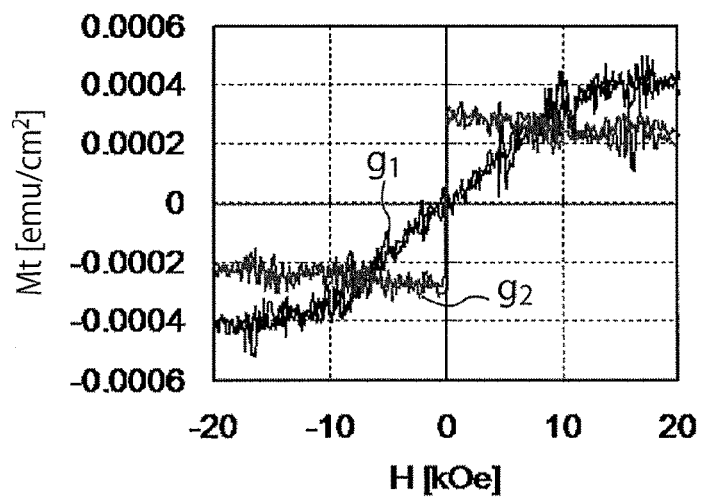

In order to deal with the problems, Heusler alloys that are known to have high spin polarization, a wide range of saturation magnetization, and low Gilbert damping factor are applied to MTJ elements. First, the magnetic characteristics of $Co_2MnAl$, which is a Heusler alloy, were investigated. FIGS. 2A to 3C show examples of magnetization curves of $Co_2MnAl$ films. The magnetization curves shown in FIGS. 2A to 2C are those for three $Co_2MnAl$ films having a thickness of 1.5 nm, which were heat-treated at temperatures of 400° C., 500° C., and 600° C., respectively. The magnetization curves shown in FIGS. 3A to 3C are those for three $Co_2MnAl$ films having a thickness of 5 nm, which were heat-treated at temperatures of 400° C., 500° C., and 600° C., respectively. In each of FIGS. 2A to 3C, the magnetization curve $g_1$ represents a case where an external magnetic field is perpendicularly applied to the film plane, and the magnetization curve $g_2$ represents a case where an external magnetic field is applied in parallel to the film plane.

As can be understood from FIGS. 2A to 3C, all the $Co_2MnAl$ films are in-plane magnetization films. This is resulted from the crystalline structure of Heusler alloys such as $Co_2MnAl$. Heusler alloys are known to have composition ratios as represented by a full Heusler $X_2YZ$ and a half Heusler XYZ, and have the cubic crystal structures. The names of crystal structures differ depending on the crystal regularity. The structures are named "$L2_1$ structure," "B2 structure," and "A2 structure" in the order of higher to lower crystal regularity. The cubic crystal structure has a very symmetrical structure, in which the magnetic anisotropy rarely occurs. Therefore, Heusler alloy thin films have in-plane magnetic characteristic as described above. As a result, Heusler alloys, which are known to have high spin polarization, do not provide high MR ratio if they are simply used to form interfacial magnetic layers of perpendicular magnetoresistive elements.

Recently, attempts have been made to produce perpendicular magnetization MTJ elements including $Co_2FeAl$ Heusler layers having interfacial anisotropic characteristics by using the same manner that helps CoFeB layers to act as perpendicular magnetization films (APEX, 5 (2012) 063003). However, as in the case of the CoFeB interfacial layers, the Heusler layers has an upper limit to act as perpendicular magnetization films, which is about 1.0 nm. Furthermore, such layers do not have a high TMR ratio.

Figure 4:
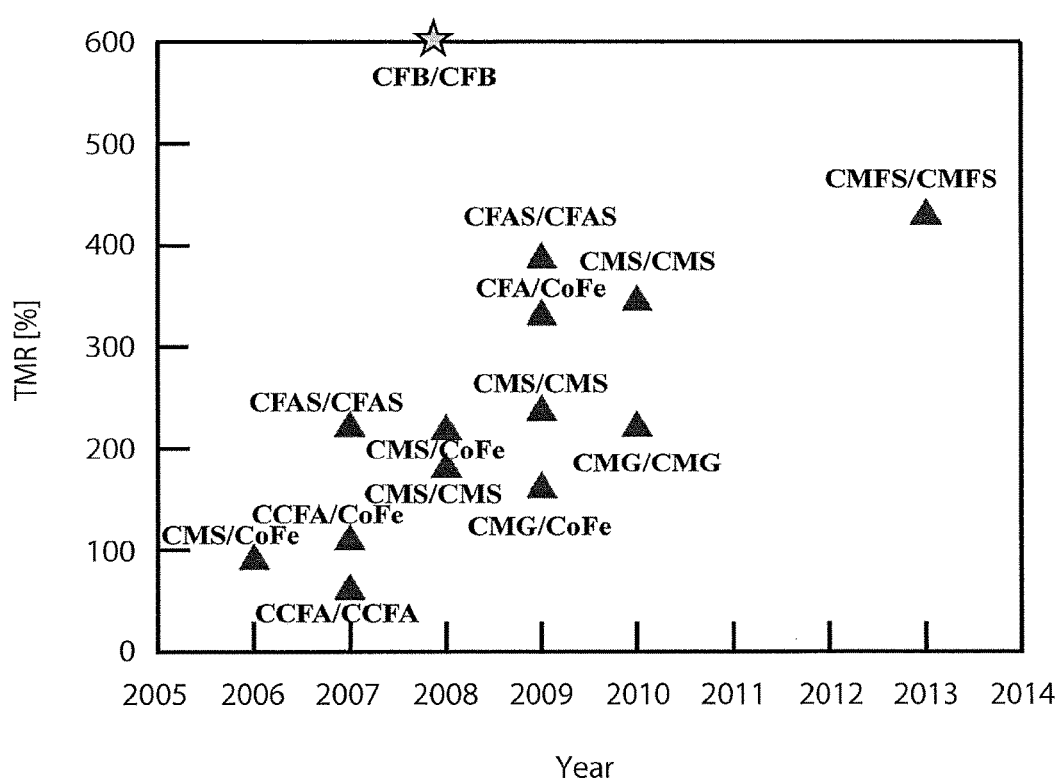
FIG. 4 is a diagram showing changes in materials of TMR elements and the TMR ratios obtained from these materials over 10 years.

FIG. 4 shows changes in materials of TMR elements and the TMR ratios obtained from these materials over 10 years. In the TMR elements, magnetic layers are formed of a Heusler alloy, and barrier layers are formed of MgO. CFB, CFA, CFAS, CMS, CCFA, CMG, and CMFS in FIG. 4 indicate CoFeB, $Co_2FeAl$, $Co_2FeAlSi$, $Co_2MnSi$, $Co_2CrFeAl$, $Co_2MnGe$, and $Co_2MnFeSi$, respectively. The TMR values in FIG. 4 are measured in in-plane MTJ elements which include thick Heusler alloy layers. It can be understood from the foregoing that a high TMR value that is achieved in in-plane Heusler MTJ elements cannot be expected within the limit of thickness of a Heusler alloy perpendicular magnetization film that has interfacial anisotropy.

With respect to the above problem, the inventors have studied hard to obtain a magnetoresistive element with low saturation magnetization, low Gilbert damping factor, high perpendicular magnetic anisotropy, and high MR ratio, and a magnetic memory including such a magnetoresistive element. Embodiments of such magnetoresistive elements and magnetic memories will be described below.

First Embodiment

Figure 5:
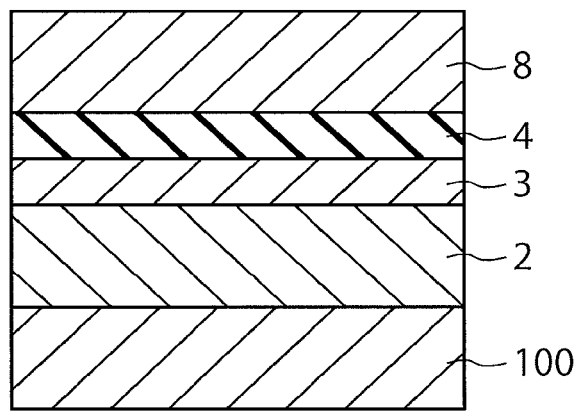
FIG. 5 is a cross-sectional view illustrating a magnetoresistive element according to a first embodiment.

FIG. 5 is a cross-sectional view of a magnetoresistive element 1 according to a first embodiment. The magnetoresistive element 1 according to the first embodiment is an MTJ element, in which a ferromagnetic layer 2, an interfacial magnetic layer 3, a nonmagnetic layer 4 ("tunnel barrier layer 4"), and a ferromagnetic layer 8 are stacked in this order on a base layer 100. The base layer 100 is used to control the crystallinity, such as the crystal orientation and the crystal grain size, of the ferromagnetic layer 2 and the layers above the ferromagnetic layer 2. The ferromagnetic layer 2 is a magnetic layer containing a least one element selected from the group consisting of Mn, Al, Ge, and Ga. In other words, the ferromagnetic layer 2 is a magnetic layer containing a least one element of Mn, Al, Ge, or Ga. As used herein, a phrase referring to "at least one of" a list of items refers to any combination of those items, including a single member. As an example, "at least one of: a, b, or c" is intended to cover a, b, c, a-b, a-c, b-c, and a-b-c."

The interfacial magnetic layer 3 is formed of a Heusler alloy, for example $Mn_2VZ$ (where V represents vanadium, and Z represents at least one element selected from the group consisting of Al and Ga). An oxide insulating material is preferably used to form the nonmagnetic layer 4. The characteristics of these layers will be described later.

The resistance value of an MTJ element is determined by the angle between magnetization directions of two magnetic layers disposed with a tunnel barrier sandwiched therebetween. The angle between magnetization directions may be controlled by an external magnetic field or a current flowing through the MTJ element. The angle between magnetization directions may be controlled more stably by causing a difference in value of the coercive field Hc, the anisotropy magnetic field Hk, or the Gilbert damping factor $\alpha$ between the two magnetic layers. The magnetic layer with a greater coercive field Hc, anisotropy magnetic field Hk, or Gilbert damping factor $\alpha$ is called "reference layer," and the magnetic layer with a smaller coercive field Hc, anisotropy magnetic field Hk, or Gilbert damping factor $\alpha$ is called "storage layer" herein. Generally, the magnetic layer used as a reference layer preferably has a greater coercive field Hc, anisotropy magnetic field Hk, or Gilbert damping factor $\alpha$, and the magnetic layer used as a storage layer preferably has a smaller coercive field Hc, anisotropy magnetic field Hk, or Gilbert damping factor $\alpha$. A magnetic layer containing Mn and at least one element selected from the group consisting of Al, Ge, and Ga is suitable for use as a storage layer since the saturation magnetization, the polarizability, the coercive field, and the anisotropy magnetic field of the magnetic layer may be controlled by the composition of the elements, as will be described later, and such a layer has low Gilbert damping factor. Furthermore, a layer of Heusler alloy such as $Mn_2VZ$ (where V represents vanadium, and Z represents at least one element selected from the group consisting of Al and Ga) is suitable for use as the interfacial magnetic layer 3 since the saturation magnetization and the lattice constant may be controlled by its constituent elements, and it has low Gilbert damping factor and high polarizability.

The magnetic layer used as the ferromagnetic layer of the first embodiment includes a material containing Mn and at least one element selected from the group consisting of Al, Ge, and Ga. The c-axis of this material serves as the easy magnetization axis. An "easy magnetization direction" means a direction in a ferromagnetic material with a certain macro size. If a spontaneous magnetization is along this direction in a state where there is no external magnetic field, the internal energy becomes the lowest. A "hard magnetization direction" also means a direction of a ferromagnetic material with a certain macro size. If a spontaneous magnetization is along this direction in a state where there is no external magnetic field, the internal energy becomes the highest. A perpendicular magnetization MTJ element may be produced by controlling the orientation of crystal so that the c-axis is perpendicular to the film plane. The "film plane" herein means a plane that is perpendicular to the stacking direction. The Heusler alloy layer such as a $Mn_2VZ$ (where Z represents at least one element selected from the group consisting of Al and Ga) layer used as the interfacial magnetic layer 3 of the first embodiment is disposed to be adjacent to the ferromagnetic layer 2 so that the ferromagnetic layer 2 and the interfacial magnetic layer 3 are magnetically coupled, and the c-axis becomes the easy magnetization axis. A perpendicular magnetization MTJ element may be produced in this manner. The thickness of the interfacial magnetic layer 3 is preferably within the range from 1.5 nm to 5 nm in order to have a high MR ratio, perpendicular magnetization film.

If the MTJ element has a multilayer structure in which, for example, a ferromagnetic layer 2 of MnGa, an interfacial magnetic layer 3 of $Mn_2VAl$, a nonmagnetic layer 4 of crystalline MgO, and a ferromagnetic layer 8 of MnGe are stacked in this order, the orientation relationship MnGe (001)/MgO(001)/$Mn_2VAl$(001)/MnGa(001) may be obtained, where (001) means that crystal is oriented so that the (001) surface is exposed on the top surface. This improves the wave number selection of tunneling electrons to lead to a greater MR ratio. Thus, a high MR ratio magnetoresistive element including magnetic layers and an interfacial magnetic layer with low saturation magnetization, low Gilbert damping factor, and high perpendicular magnetic anisotropy may be obtained.

In one of the ferromagnetic layer 2 and the ferromagnetic layer 8, the direction of magnetization is not changed before and after a write current is caused to flow through the MTJ element, and in the other, the direction of magnetization may be changed. The ferromagnetic layer with unchangeable or fixed magnetization direction is also called "reference layer," and the ferromagnetic layer with changeable magnetization is also called "storage layer." In the first embodiment, the ferromagnetic layer 2 is the storage layer, and the ferromagnetic layer 8 is the reference layer, for example.

A write current is caused to flow between the ferromagnetic layer 2 and the ferromagnetic layer 8 in a direction perpendicular to the film plane. If the ferromagnetic layer 2 is the storage layer and the ferromagnetic layer 8 is the reference layer, and the direction of magnetization of the ferromagnetic layer 2 and the direction of magnetization of the ferromagnetic layer 8 are antiparallel to (opposite to) each other, a write current is caused to flow from the ferromagnetic layer 2 to the ferromagnetic layer 8. In this case, electrons flow from the ferromagnetic layer 8 to the ferromagnetic layer 2 via the nonmagnetic layer 4. Therefore, electrons spin-polarized in the ferromagnetic layer 8 flow into the ferromagnetic layer 2. The spin-polarized electrons having the spin in the same direction as the magnetization of the ferromagnetic layer 2 pass through the ferromagnetic layer 2. However, the spin-polarized electrons having the spin in the opposite direction are subjected to the spin torque so that the direction of magnetization of the ferromagnetic layer 2 becomes the same as the direction of magnetization of the ferromagnetic layer 8. As a result, the direction of magnetization of the ferromagnetic layer 2 is switched, and becomes parallel to (in the same direction as) the direction of magnetization of the ferromagnetic layer 8. The ferromagnetic layer 2 and the interfacial magnetic layer 3 are preferably coupled with each other. In this case, the magnetization direction of the interfacial magnetic layer 3 is switched together with the magnetization direction of the ferromagnetic layer 2.

If the direction of magnetization of the ferromagnetic layer 2 and the direction of magnetization of the ferromagnetic layer 8 are parallel to each other, a write current is caused to flow from the ferromagnetic layer 8 to the ferromagnetic layer 2. In this case, electrons flow from the ferromagnetic layer 2 to the ferromagnetic layer 8 via the nonmagnetic layer 4. Electrons spin-polarized in the ferromagnetic layer 2 flow into the ferromagnetic layer 8. The spin-polarized electrons having the spin in the same direction as the direction of magnetization of the ferromagnetic layer 8 pass through the ferromagnetic layer 8. However, the spin-polarized electrons having the spin in the opposite direction to the direction of magnetization of the ferromagnetic layer 8 are reflected at the interface between the nonmagnetic layer 4 and the ferromagnetic layer 8, and flow into the ferromagnetic layer 2 via the nonmagnetic layer 4. As a result, spin torque is exerted on the magnetization of the ferromagnetic layer 2, so that the direction of magnetization of the ferromagnetic layer 2 becomes opposite to the direction of magnetization of the ferromagnetic layer 8. Thus, the direction of magnetization of the ferromagnetic layer 2 is switched and becomes antiparallel to the direction of magnetization of the ferromagnetic layer 8. Preferably, the ferromagnetic layer 2 and the interfacial magnetic layer 3 are magnetically coupled with each other. In this case, the direction of magnetization of the interfacial magnetic layer 3 is switched together with that of the ferromagnetic layer 2.

Although the magnetic layer 2 is the storage layer, the magnetic layer 8 is the reference layer, and the interfacial magnetic layer 3 is disposed on the storage layer side in the first embodiment, the roles of the layers are not limited to this case. Therefore, the magnetic layer 2 may be the reference layer, the magnetic layer 8 may be the storage layer, and the interfacial magnetic layer 3 may be disposed on the reference layer side.

Second Embodiment

Figure 6:
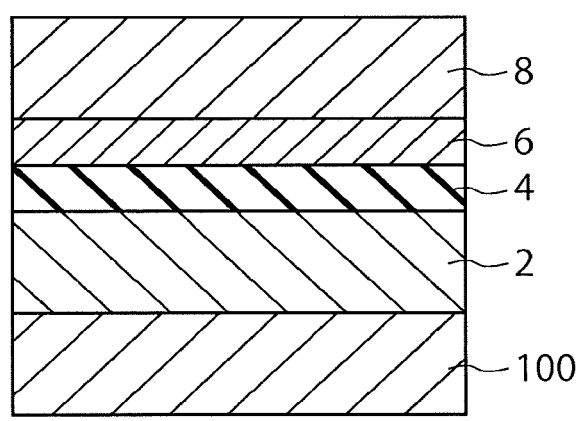
FIG. 6 is a cross-sectional view illustrating a magnetoresistive element according to a second embodiment.

FIG. 6 shows a magnetoresistive element according to a second embodiment. The magnetoresistive element 1A according to the second embodiment includes a multilayer structure in which a ferromagnetic layer 2, a nonmagnetic layer 4, an interfacial magnetic layer 6, and a ferromagnetic layer 8 are stacked in this order on a base layer 100. The ferromagnetic layer 8 is a magnetic layer containing Mn and at least one element selected from the group consisting of Al, Ge, and Ga. The interfacial magnetic layer 6 contains a Heusler alloy such as $Mn_2VZ$ (where Z represents at least one element selected from the group consisting of Al and Ga). The nonmagnetic layer 4 preferably contains an oxide insulating material. The characteristics of these layers will be described later.

As in the first embodiment, the ferromagnetic layer 2 and the ferromagnetic layer 8 may be caused to have a magnetic anisotropy perpendicular to the film plane with the easy magnetization direction being directed to be perpendicular to the film plane by controlling the crystal orientation of these ferromagnetic layers. Therefore, the magnetoresistive element 1A according to the second embodiment may be a perpendicular magnetization MTJ element in which the magnetization directions of the ferromagnetic layer 2 and the ferromagnetic layer 8 are perpendicular to the film plane, as well as an in-plane magnetization MTJ element. The direction of magnetization of one of the ferromagnetic layer 2 and the ferromagnetic layer 8 is not changed before and after a write current is caused to flow through the MTJ element 1A, and the direction of magnetization of the other may be changed. In the second embodiment, the ferromagnetic layer 2 is the storage layer, and the ferromagnetic layer 8 is the reference layer, for example. The write current is caused to flow between the ferromagnetic layer 2 and the ferromagnetic layer 8 in a direction perpendicular to the film plane, as in the first embodiment.

A layer of Heusler alloy such as $Mn_2VZ$ (where Z represents at least one element selected from the group consisting of Al and Ga) used as the interfacial magnetic layer 6 of the second embodiment is disposed to be adjacent to the ferromagnetic layer 8, which will be described later, so as to be magnetically coupled to the ferromagnetic layer 8. As a result, the c-axis is caused to be an easy magnetization axis, and a perpendicular magnetization MTJ element may be formed. The thickness of the interfacial magnetic layer 6 is preferably within the range from 1.5 nm to 5 nm so as to obtain a high MR ratio, perpendicular magnetization film.

If the MTJ element 1A has a multilayer structure in which, for example, a ferromagnetic layer 2 of MnGa, a nonmagnetic layer 4 of crystalline MgO, an interfacial magnetic layer 6 of $Mn_2VAl$, and a ferromagnetic layer 8 of MnGe are stacked in this order, the orientation relationship MnGe (001)/$Mn_2VAl$(001)/MgO(001)/MnGa(001) may be obtained, where (001) means that crystal is oriented so that the (001) surface is exposed on the top surface. This improves the wave number selection of tunneling electrons, and thus leads to a greater MR ratio. As a result, a high MR ratio magnetoresistive element including magnetic layers and an interfacial magnetic layer with low saturation magnetization, low Gilbert damping factor, and high perpendicular magnetic anisotropy may be obtained.

Although the magnetic layer 2 is the storage layer, the magnetic layer 8 is the reference layer, and the interfacial magnetic layer 6 is disposed on the reference layer side in the second embodiment, the roles of the layers are not limited to this case. Therefore, the magnetic layer 2 may be the reference layer, the magnetic layer 8 may be the storage layer, and the interfacial magnetic layer 6 may be disposed on the storage layer side.

Third Embodiment

Figure 7:
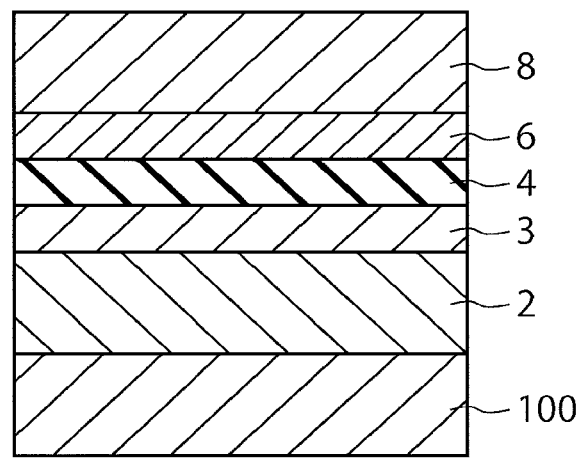
FIG. 7 is a cross-sectional view illustrating a magnetoresistive element according to a third embodiment.

FIG. 7 shows a magnetoresistive element according to a third embodiment. The magnetoresistive element 1B according to the third embodiment includes a multilayer structure, in which a ferromagnetic layer 2, an interfacial magnetic layer 3, a nonmagnetic layer 4, an interfacial magnetic layer 6, and a ferromagnetic layer 8 are stacked in this order on a base layer 100. At least one of the ferromagnetic layer 2 and the ferromagnetic layer 8 is a magnetic layer containing Mn and at least one element selected from the group consisting of Al, Ge, and Ga. At least one of the interfacial magnetic layer 3 and the interfacial magnetic layer 6 contains a Heusler alloy such as $Mn_2VZ$ (where Z represents at least one element selected from the group consisting of Al and Ga). The nonmagnetic layer 4 preferably contains an oxide insulating material. The characteristics of these layers will be described in detail later.

As in the first and second embodiments, the ferromagnetic layer 2 and the ferromagnetic layer 8 may be caused to have a magnetic anisotropy perpendicular to the film plane with the easy magnetization direction being directed to be perpendicular to the film plane by controlling the crystal orientation of these ferromagnetic layers. Therefore, the magnetoresistive element 1B according to the third embodiment may be a perpendicular magnetization MTJ element in which the magnetization directions of the ferromagnetic layer 2 and the ferromagnetic layer 8 are perpendicular to the film plane, as well as an in-plane magnetization MTJ element. The direction of magnetization of one of the ferromagnetic layer 2 and the ferromagnetic layer 8 is not changed before and after a write current is caused to flow through the MTJ element 1B, and the direction of magnetization of the other may be changed. In the third embodiment, the ferromagnetic layer 2 is the storage layer, and the ferromagnetic layer 8 is the reference layer, for example. The write current is caused to flow between the ferromagnetic layer 2 and the ferromagnetic layer 8 in a direction perpendicular to the film plane, as in the first and second embodiments.

Layers of Heusler alloy such as $Mn_2VZ$ (where Z represents at least one element selected from the group consisting of Al and Ga) used as the interfacial magnetic layer 3 and the interfacial magnetic layer 6 of the third embodiment are disposed to be adjacent to the ferromagnetic layer 2 and the ferromagnetic layer 8, which will be described later, so as to be magnetically coupled to the ferromagnetic layer 2 and the ferromagnetic layer 8. As a result, the c-axis is caused to be an easy magnetization axis, and a perpendicular magnetization MTJ element may be formed. Thus, a Heusler alloy layer containing $Mn_2VZ$ (where Z represents at least one element selected from the group consisting of Al and Ga), for example, may be applied to the interfacial magnetic layer that is adjacent to a magnetic layer containing, for example, Mn and at least one element selected from the group consisting of Al, Ge, and Ga. The thickness of the interfacial magnetic layer 3 and the interfacial magnetic layer 6 is preferably within the range from 1.5 nm to 5 nm to obtain a high MR ratio, perpendicular magnetization film.

If the MTJ element 1B has a multilayer structure in which, for example, a ferromagnetic layer 2 of MnGa, an interfacial magnetic layer 3 of $Mn_2VAl$, a nonmagnetic layer 4 of crystalline MgO, an interfacial magnetic layer 6 of $Mn_2VAl$, and a ferromagnetic layer 8 of MnGe are stacked in this order, the orientation relationship MnGe(001)/$Mn_2VAl$(001)/MgO(001)/$Mn_2VAl$(001)/MnGa(001) may be obtained, where (001) means that crystal is oriented so that the (001) surface is exposed on the top surface. This improves the wave number selection of tunneling electrons, and thus leads to a greater MR ratio. As a result, a high MR ratio magnetoresistive element including magnetic layers and interfacial magnetic layers with low saturation magnetization, low Gilbert damping factor, and high perpendicular magnetic anisotropy may be obtained.

Figure 8:
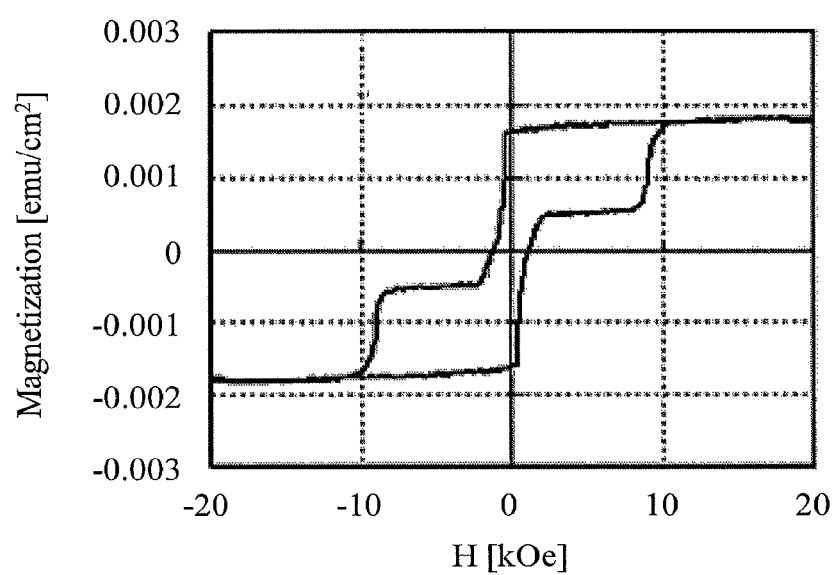
FIG. 8 is a diagram showing an example of magnetization curves of a MnGa-MTJ element including a $Co_2MnAl$ interfacial magnetic layer.

FIG. 8 shows an example of magnetization curves of an MTJ element having a multilayer structure in which a ferromagnetic layer 2 of MnGa, an interfacial magnetic layer 3 of $Co_2MnAl$, a nonmagnetic layer 4 of MgO, an interfacial magnetic layer 6 of CoFeB, and a ferromagnetic layer 8 of CoPt are stacked in this order. As can be understood from FIG. 8, the magnetization curves of the MTJ element form a two-stage loop with good quadrangle. A high MR ratio MTJ element may be obtained by using a perpendicular magnetization layer of a Heusler alloy as at least one of the interfacial magnetic layers, like this example.

Although the magnetic layer 2 is the storage layer, the magnetic layer 8 is the reference layer, the interfacial magnetic layer 3 is disposed on the storage layer side, and the interfacial magnetic layer 6 is disposed on the reference layer side in the third embodiment, the roles of the layers are not limited to this case. Therefore, the magnetic layer 2 may be the reference layer, the magnetic layer 8 may be the storage layer, the interfacial magnetic layer 3 may be disposed on the reference layer side, and the interfacial magnetic layer 6 may be disposed on the storage layer side.

Fourth Embodiment

Figure 9:
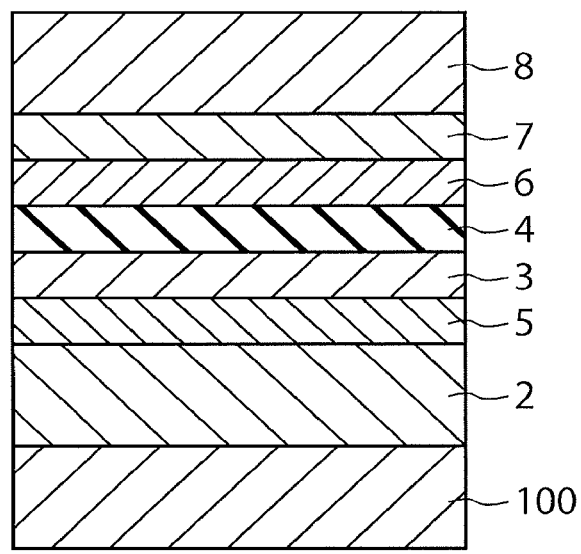
FIG. 9 is a cross-sectional view illustrating a magnetoresistive element according to a fourth embodiment.

FIG. 9 shows a magnetoresistive element according to a fourth embodiment. The magnetoresistive element 1C according to the fourth embodiment includes a multilayer structure, in which a ferromagnetic layer 2, a function layer 5, an interfacial magnetic layer 3, a nonmagnetic layer 4, an interfacial magnetic layer 6, a function layer 7, and a ferromagnetic layer 8 are stacked in this order on a base layer 100. At least one of the ferromagnetic layer 2 and the ferromagnetic layer 8 is a magnetic layer containing Mn and at least one element selected from the group consisting of Al, Ge, and Ga. At least one of the interfacial magnetic layer 3 and the interfacial magnetic layer 6 contains a Heusler alloy such as $Mn_2VZ$ (where Z represents at least one element selected from the group consisting of Al and Ga). The nonmagnetic layer 4 is preferably formed of an oxide insulating material. The characteristics of these layers will be described later.

As in the case of the first to third embodiments, the ferromagnetic layer 2 and the ferromagnetic layer 8 may be cased to have a magnetic anisotropy perpendicular to the film plane with the easy magnetization direction being directed to be perpendicular to the film plane by controlling the crystal orientation of these ferromagnetic layers. Therefore, the magnetoresistive element 1C according to the fourth embodiment may be a perpendicular magnetization MTJ element in which the magnetization directions of the ferromagnetic layer 2 and the ferromagnetic layer 8 are perpendicular to the film plane, as well as an in-plane magnetization MTJ element. The direction of magnetization of one of the ferromagnetic layer 2 and the ferromagnetic layer 8 is not changed before and after a write current is caused to flow through the MTJ element 1C, and the direction of magnetization of the other may be changed. In the fourth embodiment, the ferromagnetic layer 2 is the storage layer, and the ferromagnetic layer 8 is the reference layer, for example. The write current is caused to flow between the ferromagnetic layer 2 and the ferromagnetic layer 8 in a direction perpendicular to the film plane, as in the first to third embodiments.

Layers of Heusler alloy layer such as $Mn_2VZ$ (where Z represents at least one element selected from the group consisting of Al and Ga) used as the interfacial magnetic layer 3 and the interfacial magnetic layer 6 of the fourth embodiment are disposed to be adjacent to the ferromagnetic layer 2 and the ferromagnetic layer 8, which will be described later, so as to be magnetically coupled to the ferromagnetic layer 2 and the ferromagnetic layer 8. As a result, the c-axis is caused to be an easy magnetization axis, and a perpendicular magnetization MTJ element may be formed. Thus, a Heusler alloy layer containing $Mn_2VZ$ (where Z represents at least one element selected from the group consisting of Al and Ga), for example, may be applied to the interfacial magnetic layer that is adjacent to a magnetic layer containing, for example, Mn and at least one element selected from the group consisting of Al, Ge, and Ga. The thickness of the interfacial magnetic layer 3 and the interfacial magnetic layer 6 is preferably within the range from 1.5 to 5 nm to obtain a high MR ratio, perpendicular magnetization film.

The roles of the function layer 5 and the function layer 7 in the fourth embodiment will be described below. The function layers 5 and 7 are disposed to suppress the mixture of materials of the ferromagnetic layer and the interfacial magnetic layer caused by element diffusion. Thus, the function layers 5 and 7 are required to prevent diffusion of any element from the ferromagnetic layer 2 and the ferromagnetic layer 8 that are magnetic layer containing Mn and at least one element selected from the group consisting of Al, Ge, and Ga, to the interfacial magnetic layer 3 and the interfacial magnetic layer 6. From this viewpoint, the function layer 5 and the function layer 7 of the fourth embodiment are preferably nonmagnetic layers containing at least one element selected from the group consisting of Mg, Ba, Ca, Sr, Sc, Y, Nb, Gd, Tb, Dy, Ce, Ho, Yb, Er, B, C, and N.

As described above, the ferromagnetic layer 2 and the interfacial magnetic layer 3 are preferably magnetically coupled with each other, and the ferromagnetic layer 8 and the interfacial magnetic layer 6 are preferably magnetically coupled with each other. In order to achieve this, the thickness of the function layers has an upper limit. The inventors have found through the study that the thickness is preferably thick enough to have a diffusion prevention effect, and thin enough not to cut the magnetic coupling. The inventors have found that such function layers have a thickness ranging from 0.3 nm to 1.5 nm. The function layer 5 and the function layer 7 will be described in detail later.

If the MTJ element 1C includes a multilayer structure in which, for example, a ferromagnetic layer 2 of MnGa, a function layer 5 of Mg, an interfacial magnetic layer 3 of $Mn_2VAl$, a nonmagnetic layer 4 of crystalline MgO, an interfacial magnetic layer 6 of $Mn_2VAl$, a function layer 7 of Mg, and a ferromagnetic layer 8 of MnGe are stacked in this order, the orientation relationship MnGe(001)/$Mn_2VAl$(001)/MgO(001)/$Mn_2VAl$(001)/MnGa (001) may be obtained, where (001) means that crystal is oriented so that the (001) surface is exposed on the top surface. The Mg layers are preferably ultra-thin layers. If the Mg layer is too thick, the Mg layer forms an HCP (Hexagonal Closed-Packed) crystal, which affects the crystal orientation of the layers above the Mg layer. The function layer prevents element diffusion, and thus suppresses the degradation in magnetic characteristics of the interfacial magnetic layer, and maintains the wave number selection of tunneling electrons. As a result, a high MR ratio may be obtained. Thus, a high MR ratio magnetoresistive element including magnetic layers and interfacial magnetic layers with low saturation magnetization, low Gilbert damping factor, and high perpendicular magnetic anisotropy may be obtained.

Although the magnetic layer 2 is the storage layer, the magnetic layer 8 is the reference layer, the interfacial magnetic layer 3 is the interfacial magnetic layer on the storage layer side, and the interfacial magnetic layer 6 is the interfacial magnetic layer on the reference layer side in the fourth embodiment, the roles of the layers are not limited to this case. Therefore, the magnetic layer 2 may be the reference layer, the magnetic layer 8 may be the storage layer, the interfacial magnetic layer 3 may be the interfacial magnetic layer on the reference layer side, and the interfacial magnetic layer 6 may be the interfacial magnetic layer on the storage layer side.

(Modifications)

Figure 10:
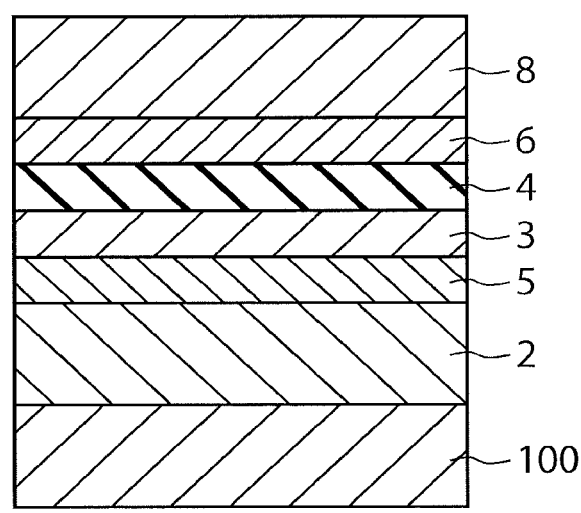
FIG. 10 is a cross-sectional view illustrating a magnetoresistive element according to a first modification of the fourth embodiment.
Figure 11:
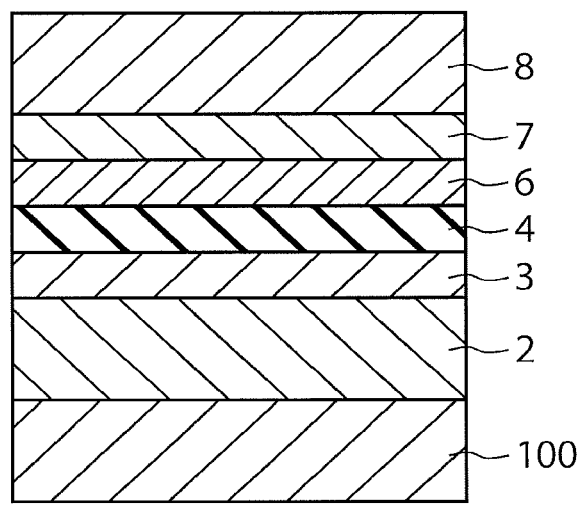
FIG. 11 is a cross-sectional view illustrating a magnetoresistive element according to a second modification of the fourth embodiment.

The fourth embodiment includes a multilayer structure in which the ferromagnetic layer 2, the function layer 5, the interfacial magnetic layer 3, the nonmagnetic layer 4, the interfacial magnetic layer 6, the function layer 7, and the ferromagnetic layer 8 are stacked in this order on the base layer 100. However, depending on the materials selected to form the ferromagnetic layer 2 and the ferromagnetic layer 8, the multilayer structure may include at least one of the function layer 5 and the function layer 7 since a function layer is effective when it is in contact with a magnetic layer containing Mn and at least one element selected from the group consisting of Al, Ge, and Ga. If the magnetoresistive element includes a ferromagnetic layer containing Mn and at least one element selected from the group consisting of Al, Ge, and Ga as the ferromagnetic layer 2, but does not include such a layer as the ferromagnetic layer 8, the multilayer structure may be formed such that the base layer 100, the ferromagnetic layer 2, the function layer 5, the interfacial magnetic layer 3, the nonmagnetic layer 4, the interfacial magnetic layer 6, and the ferromagnetic layer 8 are stacked in this order, like a magnetoresistive element 1D according to a first modification of the fourth embodiment shown in FIG. 10. If the magnetoresistive element includes a ferromagnetic layer including a magnetic layer containing Mn and at least one element selected from the group consisting of Al, Ge, and Ga as the ferromagnetic layer 8, but does not include such a layer as the ferromagnetic layer 2, the multilayer structure may be formed such that the base layer 100, the ferromagnetic layer 2, the interfacial magnetic layer 3, the nonmagnetic layer 4, the interfacial magnetic layer 6, the function layer 7 and the ferromagnetic layer 8 are stacked in this order, like a magnetoresistive element 1E according to a second modification of the fourth embodiment shown in FIG. 11.

Although the magnetic layer 2 is the storage layer, the magnetic layer 8 is the reference layer, the interfacial magnetic layer 3 is the interfacial magnetic layer on the storage layer side, and the interfacial magnetic layer 6 is the interfacial magnetic layer on the reference layer side in the modifications of the fourth embodiment, the roles of the layers are not limited to this case. Therefore, the magnetic layer 2 may be the reference layer, the magnetic layer 8 may be the storage layer, the interfacial magnetic layer 3 may be the interfacial magnetic layer on the reference layer side, and the interfacial magnetic layer 6 may be the interfacial magnetic layer on the storage layer side.

Fifth Embodiment

Figure 12:
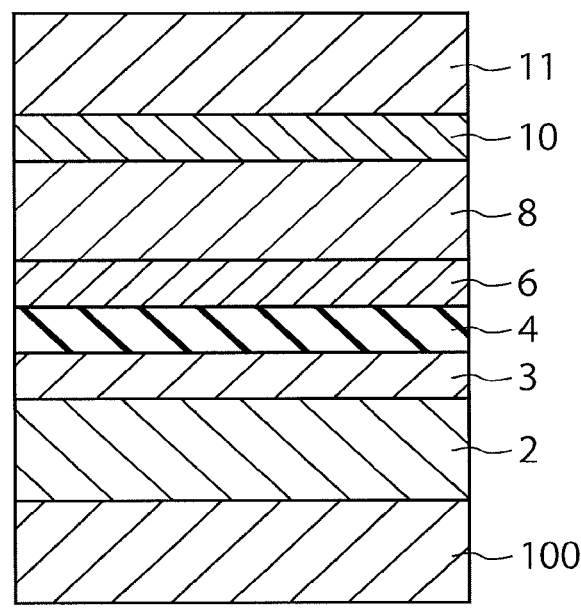
FIG. 12 is a cross-sectional view illustrating a magnetoresistive element according to a fifth embodiment.

FIG. 12 shows a magnetoresistive element according to a fifth embodiment. The magnetoresistive element 1F according to the fifth embodiment is obtained by stacking a nonmagnetic layer 10 and a ferromagnetic layer 11 on the ferromagnetic layer 8 in the magnetoresistive element 1B according to the third embodiment shown in FIG. 7. In the fifth embodiment, the interfacial magnetic layer 6 and the ferromagnetic layer 8 serve as the reference layer, for example. The ferromagnetic layer 11 is also called "bias layer" or "shift adjustment layer," and has a magnetization direction that is antiparallel to (opposite to) that of the ferromagnetic layer 8. The ferromagnetic layer 11 may be antiferromagnetically coupled with the ferromagnetic layer 8 (by Synthetic Anti-Ferromagnetic (SAF) coupling) via the nonmagnetic layer 10. This allows the reduction and adjustment of the shift in critical current for magnetization reversal in the storage layer including the interfacial magnetic layer 3 and the ferromagnetic layer 2, caused by a strayed magnetic field from the reference layer including the interfacial magnetic layer 6 and the ferromagnetic layer 8. The nonmagnetic layer 10 preferably has heat resistance by which the ferromagnetic layer 8 and the ferromagnetic layer 11 are not mixed with each other during a heat treatment, and a function to control the crystal orientation of the ferromagnetic layer 11.

If the thickness of the nonmagnetic layer 10 increases, the shift adjustment magnetic field applied from the ferromagnetic layer 11 to the storage layer (in the fifth embodiment the ferromagnetic layer 2, for example) decreases since the distance between the ferromagnetic layer 11 and the storage layer increases. Therefore, the thickness of the nonmagnetic layer 10 is preferably 5 nm or less. Furthermore, as described above, the ferromagnetic layer 11 may be antiferromagnetically coupled with the ferromagnetic layer 8 via the nonmagnetic layer 10 by the SAF coupling. In this case, however, the magnetic coupling may be cut if the nonmagnetic layer 10 is too thick. Also from this viewpoint, the thickness of the nonmagnetic layer 10 is preferably 5 nm or less. The ferromagnetic layer 11 contains a ferromagnetic material having an easy magnetization axis that is perpendicular to the film plane. Since the ferromagnetic layer 11 is more distant from the storage layer than the reference layer, the thickness or the saturation magnetization Ms of the ferromagnetic layer 11 should be set greater than that of the reference layer in order to adjust the strayed magnetic field applied to the storage layer by means of the ferromagnetic layer 11. According to the study of the inventors, the following relational expression should be met:

$$Ms_2 \times t_2 < Ms_3 \times t_3$$

where $t_2$ is the thickness of the reference layer, $Ms_2$ is the saturation magnetization of the reference layer, $t_3$ is the thickness of the ferromagnetic layer 11, and $Ms_3$ is the saturation magnetization of the ferromagnetic layer 11.

The ferromagnetic layer 11 of the fifth embodiment may also be applied to the magnetoresistive elements according to the first, second, and fourth embodiments. In this case, the ferromagnetic layer 11 is stacked on the ferromagnetic layer 8 serving as the reference layer, with the nonmagnetic layer 10 being sandwiched therebetween.

(Modifications)

Figure 13:
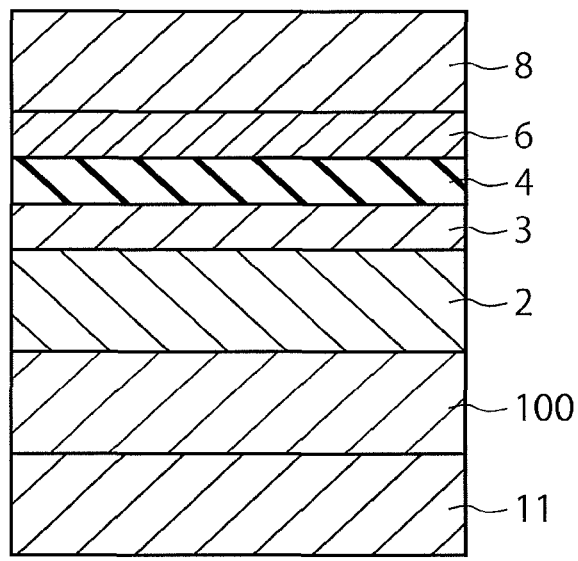
FIG. 13 is a cross-sectional view illustrating a magnetoresistive element according to a first modification of the fifth embodiment.

The fifth embodiment has a top bias structure in which the ferromagnetic layer 2, the interfacial magnetic layer 3, the nonmagnetic layer 4, the interfacial magnetic layer 6, the ferromagnetic layer 8, the nonmagnetic layer 10, and the ferromagnetic layer 11 are stacked in this order on the base layer 100. However, the ferromagnetic layer 11 may be disposed below the base layer 100. Specifically, a bottom bias structure in which the base layer 100, the ferromagnetic layer 2, the interfacial magnetic layer 3, the nonmagnetic layer 4, the interfacial magnetic layer 6, and the ferromagnetic layer 8 are stacked in this order on the ferromagnetic layer 11 may be employed, as in a magnetoresistive element 1G according to a first modification of the fifth embodiment shown in FIG. 13. In this case, the ferromagnetic layer 2 is preferably used as the reference layer.

Figure 14:
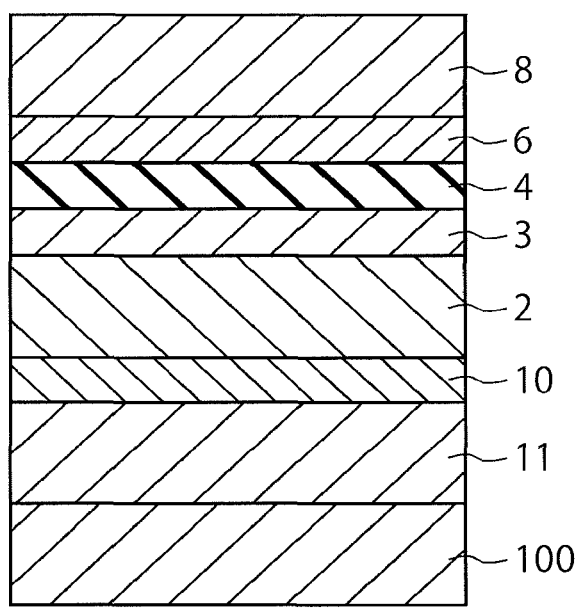
FIG. 14 is a cross-sectional view illustrating a magnetoresistive element according to a second modification of the fifth embodiment.

The stacking order may be reversed, as in a magnetoresistive element 1H according to a second modification of the fifth embodiment shown in FIG. 14. Specifically, the base layer 100, the ferromagnetic layer 11, the nonmagnetic layer 10, the ferromagnetic layer 2, the interfacial magnetic layer 3, the nonmagnetic layer 4, the interfacial magnetic layer 6, and the ferromagnetic layer 8 may be stacked in this order.

In both of the above modifications, the amount of strayed magnetic field to be applied to the storage layer by the ferromagnetic layer 11 should be set to be substantially the same as the amount of strayed magnetic field to be applied to by the reference layer, as described in the descriptions of the fifth embodiment. Thus, if the distance between the storage layer and the shift adjustment layer is shorter than the distance between the storage layer and the reference layer, the following relational expression should be met:

total amount of magnetization in the shift adjustment layer<total amount of magnetization of the reference layer.

On the other hand, if the distance between the storage layer and the shift adjustment layer is longer than the distance between the storage layer and the reference layer, the following relational expression should be met:

total amount of magnetization of the shift adjustment layer>total amount of magnetization of the reference layer.

According to the fifth embodiment and its modifications, a magnetoresistive element with a high MR ratio, including magnetic layers and interfacial magnetic layers having low saturation magnetization, low Gilbert damping factor, and high perpendicular magnetic anisotropy may be obtained, like the first to fourth embodiments.

(MTJ Element Including Magnetic Film Having Monocrystalline Structure)

A method for manufacturing an MTJ element including a magnetic film having a monocrystalline structure ("monocrystalline MTJ element") will be described. It is preferable that at least one of the ferromagnetic layer 2, the ferromagnetic layer 8, the interfacial magnetic layer 3, and the interfacial magnetic layer 6 of a magnetoresistive element (MTJ element) according to any of the first to fifth embodiments and their modifications have a monocrystalline structure. The reason for this is that the monocrystalline structure in which the crystal orientation in the film plane is in the same direction may enhance the magnetic coupling in the film plane, and thus considerably suppresses variations in magnetic characteristics in the magnetic film. Furthermore, the formation of grain boundary is suppressed, and therefore a magnetic film or an insulating layer with a smooth surface in the atomic level and a good crystallinity may be formed. Accordingly, the MR ratio (TMR ratio) of the MTJ element may become greater than conventional MTJ elements. Therefore, monocrystalline MTJ elements are needed to manufacture large-capacity MRAMs of tens of Gbits.

However, it is not possible to grow a monocrystalline film on wiring lines of a circuit since the wiring lines generally have polycrystalline or amorphous structures. Therefore, it is difficult to form monocrystalline MTJ elements on a substrate with transistors.

An MRAM with monocrystalline MTJ elements, however, may be formed by preparing a monocrystalline substrate on which monocrystalline MTJ elements are formed and a substrate on which transistors are formed, bonding the monocrystalline substrates with the MTJ elements and the substrate with the transistors, and removing the monocrystalline substrate, which is not needed. This method will be described with reference to FIGS. 15A to 16C.

First, MTJ elements according to any of the first to fifth embodiments are formed on a silicon (Si) monocrystalline substrate under appropriate conditions. For example, a base layer 100, a ferromagnetic layer 2, an interfacial magnetic layer 3, a nonmagnetic layer 4, and a ferromagnetic layer 8 are disposed on a Si monocrystalline substrate 200 in this order by a sputtering method or a molecular beam epitaxy (MBE) method, as shown in FIG. 15A, to obtain an MTJ element 1 according to the first embodiment. The crystallinity of the Si monocrystalline substrate 200 is conveyed to the base layer 100, the ferromagnetic layer 2, the interfacial magnetic layer 3, the nonmagnetic layer 4, and the ferromagnetic layer 8 to make monocrystalline the MTJ element 1. Thereafter, a metal adhesion layer 20a is formed on the ferromagnetic layer 8 (FIG. 15A). Similarly, a substrate 220 is prepared, on which a transistor circuit and wiring lines are formed, and a metal adhesion layer 20b is formed on the substrate 220 (FIG. 15A). The metal adhesion layers 20a and 20b are formed of a metal such as Al, Au, Cu, Ti, and Ta.

The substrate 200, on which the monocrystalline MTJ element 1 is formed, and the substrate 220, on which the transistor circuit is formed are arranged so that the metal adhesion layers 20a and 20b face each other. Subsequently, the metal adhesion layers 20a and 20b are brought into contact with each other as shown in FIG. 15B. The metal adhesion layers 20a and 20b are bonded together by applying a pressure to them. The layers may be heated when being pressed, in order to improve the bonding force.

Figure 16A:
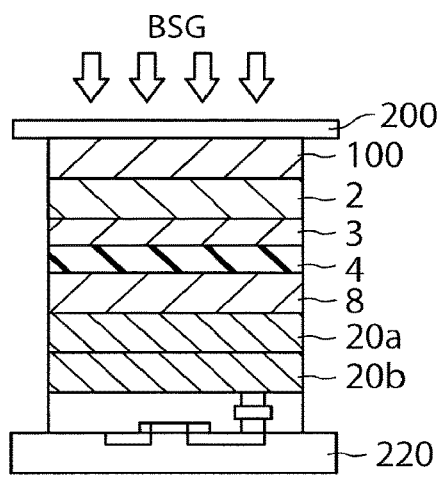
FIGS. 16A to 16C are explanatory diagrams illustrating the method of manufacturing an MTJ element including a magnetic film having a monocrystalline structure.
Figure 16B:
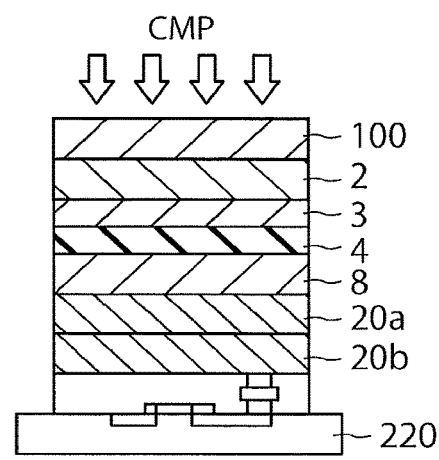
Figure 16C:
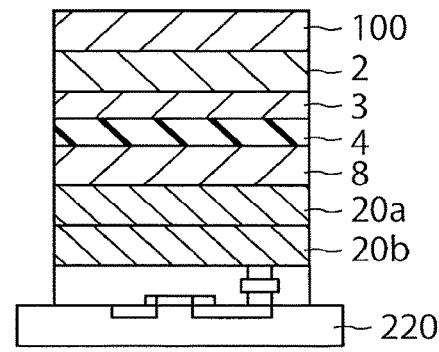

Thereafter, the monocrystalline substrate 200, on which the monocrystalline MTJ element 1 is formed, is removed as shown in FIG. 16A. The removal is performed by first thinning the monocrystalline substrate 200 by backside grinding (BSG), and then mechanically polishing the thinned monocrystalline substrate 200 by chemical mechanical polishing (CMP) as shown in FIG. 16B. As a result, the MTJ element is obtained (FIG. 16C).

As described above, the monocrystalline MTJ element according to any of the first to fifth embodiments and their modifications can by produced by preparing the monocrystalline substrate 200, on which the monocrystalline MTJ element according to any of the first to fifth embodiments and their modifications is formed, and the substrate 220, on which a transistor circuit is formed, bonding the substrate with the transistor circuit on the monocrystalline MTJ element, and removing the monocrystalline substrate 200 that is not needed.

Next, the specific structure of each of the layers included in the MTJ element according to any of the first to fifth embodiments and their modifications will be described in the order of the ferromagnetic layer 2, the ferromagnetic layer 8, the base layer 100, the nonmagnetic layer 4, the interfacial magnetic layer 3, the interfacial magnetic layer 6, the function layer 5, and the function layer 7. In the following descriptions, the ferromagnetic layer 2 is the storage layer, the ferromagnetic layer 8 is the reference layer, the interfacial magnetic layer 3 is disposed on the storage layer side, and the interfacial magnetic layer 6 is disposed on the reference layer side. It is not necessary, however, that the storage layer is disposed to the lower portion of the multilayer structure. Therefore, the ferromagnetic layer 2 may be the reference layer, the ferromagnetic layer 8 may be the storage layer, the interfacial magnetic layer 3 may be disposed on the reference layer side, and the interfacial magnetic layer 6 may be disposed on the storage layer side.

(Ferromagnetic Layer 2)

The ferromagnetic layer 2 is preferably formed of a magnetic material having the perpendicular magnetization, having low saturation magnetization Ms, high magnetic anisotropy energy Ku to maintain the thermal stability factor A to perform magnetization switching with a high thermal stability and a low electric current, and having a coercive field, anisotropy magnetic field, or Gilbert damping factor lower than that of the magnetic material of the ferromagnetic layer 8. Furthermore, the magnetic material of the ferromagnetic layer 2 preferably has high polarizability.

The ferromagnetic layer 2 will be specifically described below.

A first specific example of the ferromagnetic layer 2 is a magnetic film containing Mn and at least one element selected from the group consisting of Al, Ge, and Ga. Specific examples of the magnetic material of the ferromagnetic layer 2 include MnGa, MnAl, MnGe, and MnAlGe.

A second specific example is a magnetic film containing Mn, Ga, and at least one element selected from the group consisting of Al, Ge, Ir, Cr, Co, Pt, Ru, Pd, Rh, Ni, Fe, Re, Au, Cu, B, C, P, Gd, Tb, and Dy. Specific examples include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In order to provide the perpendicular magnetic anisotropy to the aforementioned materials, the c-axis should be grown along a direction perpendicular to the film plane, i.e., (001) orientation growth should be performed. Specifically, it is possible to control the crystal orientation growth of the ferromagnetic layer 2 by appropriately selecting the material of the base layer 100. The details of the base layer 100 will be described later.

A third specific example is a magnetic film of an alloy containing at least one element selected from the group consisting of Fe, Co, and Ni, and at least one element selected from the group consisting of Ru, Rh, Pd, Ag, Ir, Pt, and Au, or a laminated structure of these materials. Specific examples of the laminated structure include Co/Pt artificial superlattice, Co/Pd artificial superlattice, Co/Ru artificial superlattice, and Co/Au artificial superlattice. The perpendicular magnetic anisotropy and the saturation magnetization of these artificial superlattices may be adjusted by adding further elements to the ferromagnetic film, or adjusting the ratio in thickness between the ferromagnetic film and the nonmagnetic film. Specific examples of the alloy include ferromagnetic alloys such as FeRh, FePt, FePd, and CoPt.

In order to switch the magnetization with a low electric current, the thickness of the ferromagnetic layer 2 needs to be reduced as much as possible. A preferable thickness in this viewpoint is about 1 nm to 5 nm. However, crystalline materials capable of obtaining a high thermal stability factor A by the crystalline magnetic anisotropy may have a problem of degraded anisotropy if the film thickness of these materials is reduced. From this viewpoint, the film thickness is preferably equal to or more than the critical thickness of the crystal, and 10 nm or less.

(Ferromagnetic Layer 8)

The ferromagnetic layer 8 is preferably formed of a magnetic material having an easy magnetization axis that is perpendicular to the film plane, having high magnetic anisotropy energy Ku to maintain the thermal stability factor A, and having a coercive field, anisotropy magnetic field, or Gilbert damping factor higher than that of the ferromagnetic layer 2. In order to reduce the influence of the strayed magnetic field from the reference layer, the magnetic material preferably has low saturation magnetization Ms and high polarizability.

The ferromagnetic layer 8 will be specifically described below.

A first specific example of the ferromagnetic layer 8 is a magnetic film containing Mn and at least one element selected from the group consisting of Al, Ge, and Ga. Specific examples of the magnetic material of the ferromagnetic layer 8 include MnGa, MnAl, MnGe, and MnAlGe.

A second specific example is a magnetic film containing Mn, Ga, and at least one element selectee from the group consisting of Al, Ge, Ir, Cr, Co, Pt, Ru, Pd, Rh, Ni, Fe, Re, Au, Cu, B, C, P, Gd, Tb, and Dy. Specific examples include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In order to provide the perpendicular magnetic anisotropy to the aforementioned materials, the c-axis should be grown along a direction perpendicular to the film plane, i.e., (001) orientation growth should be performed. Specifically, it is possible to control the crystal orientation growth of the ferromagnetic layer 8 by appropriately selecting the materials of the nonmagnetic layer 4 and the interfacial magnetic layer 6. The details of the nonmagnetic layer 4 and the interfacial magnetic layer 6 will be described later.

A third specific example is a magnetic film of an alloy containing a metal that has the (111) crystal orientation of a face-centered cubic (FCC) structure or has the (0001) crystalline orientation of the hexagonal close-packed (HCP) structure, or a metal that may form an artificial superlattice. Examples of the metal that has the (111) crystal orientation of a face-centered cubic (FCC) structure or the (0001) crystalline orientation of the hexagonal close-packed (HCP) structure include an alloy containing at least one element selected from the group consisting of Fe, Co, Ni, and Cu, and at least one element selected from the group consisting of Pt, Pd, Rh, and Au. Specific examples include ferromagnetic alloys such as CoPd, CoPt, NiCo, and NiPt.

Examples of the artificial superlattice used in the ferromagnetic layer 8 is a structure alternately including layers of an alloy (ferromagnetic films) containing a least one element selected from the group consisting of Fe, Co, and Ni, and layers of an alloy (nonmagnetic films) containing at least one element selected from the group consisting of Cr, Pt, Pd, Ir, Rh, Ru, Os, Re, Au, and Cu. Specific examples include Co/Pt artificial superlattice, Co/Pd artificial superlattice, CoCr/Pt artificial superlattice, Co/Ru artificial superlattice, Co/Os artificial superlattice, Co/Au artificial superlattice, and Ni/Cu artificial superlattice. The perpendicular magnetic anisotropy and the saturation magnetization of these artificial superlattices may be adjusted by adding further elements to the ferromagnetic film, or adjusting the ratio in thickness between the ferromagnetic film and the nonmagnetic film.

A fourth specific example is a magnetic film of an alloy containing at least one element selected from the group consisting of transition metals Fe, Co, and Ni, and at least one element selected from the group consisting of rare earth metals Tb, Dy, and Gd. Specific examples include TbFe, TbCo, TbFeCo, DyTbFeCo, and GdTbCo. A multilayer structure obtained by alternately stacking layers of these alloys may also be employed. Specific examples of the multilayer structure include TbFe/Co, TbCo/Fe, TbFeCo/CoFe, DyFe/Co, DyCo/Fe, and DyFeCo/CoFe. The perpendicular magnetic anisotropy and the saturation magnetization of these alloys may be adjusted by adjusting the thickness ratio and the compositions.

A fifth specific example is a magnetic film of an alloy containing at least one element selected from the group consisting of Fe, Co, Ni, and Cu, and at least one element selected from the group consisting of Pt, Pd, Rh, and Au. Specific examples include ferromagnetic alloys such as FeRh, FePt, FePd, and CoPt.

(Base Layer 100)

The base layer 100 is used to control the crystallinity such as the crystal orientation and the crystal grain size of the ferromagnetic layer 2 and the layers above the ferromagnetic layer 2. Therefore, the selection of the material of the base layer 100 is important. The material and the structure of the base layer 100 will be described below. Although both conductive and insulating materials may be used to form the base layer, a conductive material is more preferable if electric current needs to flow through the base layer.

A first specific example of the base layer 100 is a nitride layer having a (001) oriented NaCl structure, and containing at least one element selected from the group consisting of Ti, Zr, Nb, V, Hf, Ta, Mo, W, B, Al, and Ce.

A second specific example of the base layer 100 is a layer of (002) oriented perovskite oxide containing $ABO_3$, where the A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb.

A third specific example of the base layer 100 is a layer of oxide having a (001) oriented NaCl structure, and containing at least one element selected from the group consisting of Mg, Al, and Ce.

A fourth specific example of the base layer 100 is a layer having a (001) oriented tetragonal structure or cubic structure, and containing at least one element selected from the group consisting of Al, Cr, Fe, Co, Rh, Pd, Ag, Ir, Pt, Au, Mo, and W.

A fifth specific example of the base layer 100 has a multilayer structure in which two or more layers of the first to fourth specific examples are stacked. By selecting the structure of the base layer, the crystallinity of the ferromagnetic layer 2 and the layers above the ferromagnetic layer 2 may be controlled to improve the magnetic characteristics.

(Nonmagnetic Layer 4)

The nonmagnetic layer 4 may be of conductive or insulating material, but is preferably a tunnel barrier layer of an insulating material. The nonmagnetic layer 4 may have a selective tunneling conduction property and a high MR ratio by appropriately selecting adjacent layers such as ferromagnetic layer and interfacial magnetic layer. Therefore, the selection of the nonmagnetic layer 4 is important. The material of the nonmagnetic layer 4 will be described below.

The tunnel barrier layer may be formed of an oxide containing at least one element selected from the group consisting of Mg, Ca, Ba, Al, Be, Sr, Zn, Ti, V, and Nb. Specific examples include MgO, AlO, ZnO, SrO, BaO, and TiO. The crystal structure of the oxide is preferably the NaCl structure. Specific examples of such a material include MgO, CaO, SrO, BaO, TiO, VO, and NbO. The oxide having the NaCl structure may be easily grown with the (001) surface being preferred orientation surface if it is grown on a single metal layer of Fe, Co, or Ni, a layer of alloy containing two or more of Fe, Co, and Ni as main constituent elements, a layer of a metal having a body-centered cubic structure with preferred orientation of (001), a layer of alloy containing Mn and at least one element selected from the group consisting of Al, Ge, and Ga, or the (001) surface of a Heusler alloy. In particular, it is possible to achieve preferred orientation of (001) surface if crystal is grown on a CoFe—X amorphous alloy, to which a very small amount of at least one element selected from the group consisting of B, C, N, Ti, Ta, P, Mo, Si, W, and Nb is added to improve the amorphous property, where X indicates the added element such as B, C, and N.

The tunnel barrier layer may be of a mixed crystal containing two or more materials selected from the aforementioned oxides, or have a multilayer structure including layers of such oxides. Examples of the mixed crystal include MgAlO, MgZnO, MgTiO, and MgCaO. Examples of two-layer multilayer structure include MgO/ZnO, MgO/AlO, TiO/AlO, and MgAlO/MgO. Examples of three-layer multilayer structure include AlO/MgO/AlO, ZnO/MgO/ZnO, and MgAlO/MgO/MgAlO.

A second specific example of the tunnel barrier layer is a (002) oriented perovskite oxide of $ABO_3$, where the A-site is occupied by at least one element selected from the group consisting of Sr, Ce, Dy, La, K, Ca, Na, Pb, and Ba, and the B-site is occupied by at least one element selected from the group consisting of Ti, V, Cr, Mn, Fe, Co, Ni, Ga, Nb, Mo, Ru, Ir, Ta, Ce, and Pb. Specific examples include $SrTiO_3$, $SrRuO_3$, $SrNbO_3$, $BaTiO_3$, and $PbTiO_3$. The lattice constant of the [100] surface of these oxides is about 3.7 Å to 4.0 Å, which varies depending on the constituent elements of the oxides. However, the lattice constant of the above oxides substantially matches that of a Heusler alloy or an alloy containing Mn and at least one element selected from the group consisting of Al, Ge, and Ga. Accordingly, these oxides are suitable for forming an interface with good quality to obtain a higher MR ratio.

A third specific example of the tunnel barrier layer is a spinel oxide of MgAlO. The lattice constant of $MgAl_2O_4$ having the spinel structure is about 4.05 Å, which varies depending on the composition ratio. MgAlO may not cause a great lattice mismatch with a Heusler alloy or an alloy containing Mn and at least one element selected from the group consisting of Al, Ge, and Ga. Accordingly, the spinel oxide of MgAlO is suitable for forming an interface with good quality to obtain a higher MR ratio.

A great lattice mismatch may cause dislocation at the interface in order to reduce the interfacial energy caused by the lattice strain. If this happens, crystal grains may have an epitaxial relationship, and thus it is difficult to cause uniform epitaxial growth in the entire film plane. If a current flows through an MTJ element in this state, the MR ratio may be reduced since the dislocation serves as an electron scattering source. Therefore, in order to cause uniform epitaxial growth in the entire film plane without causing dislocation, it is important to stack layers containing materials that do not cause great lattice mismatch.

The tunnel barrier layer may be formed of either crystalline or amorphous material. If the tunnel barrier layer is formed of a crystalline material, the electron scattering in the tunnel barrier layer may be suppressed. This may improves the ratio of selective tunnel transport of electrons from the ferromagnetic layer with the wave number being maintain, thereby improving the MR ratio. Therefore, in order to obtain a greater MR ratio, a tunnel barrier layer of a crystalline material is more preferable.

(Interfacial Magnetic Layer 3 and Interfacial Magnetic Layer 6)

The interfacial magnetic layer 3 and the interfacial magnetic layer 6 are perpendicular magnetization films. In order to meet the requirements of a high thermal stability and a low-current magnetization switching, these layers are preferably formed of a material with a high magnetic anisotropy Ku to maintain the thermal stability factor A, a low Gilbert damping factor, and a high polarizability. In order to reduce the strayed magnetic field to the storage layer, the interfacial magnetic layer 6 preferably has a low saturation magnetization. Examples of a material meeting the above requirements include Heusler alloys. The Heusler alloys will be more specifically described below.

Heusler alloys have compositions represented by $X_2YZ$ or XYZ. There are many combinations of X, Y, and Z representing many materials. Some of full Heusler alloys $X_2YZ$ and half Heusler alloys XYZ will be described below, which are suitable to form interfacial magnetic layers of the first to fifth embodiment and their modifications in viewpoints of Curie temperature Tc, magnetic moment $P_B$, and lattice constant a.

(Full Heusler Alloy $X_2YZ$)

Figure 17:
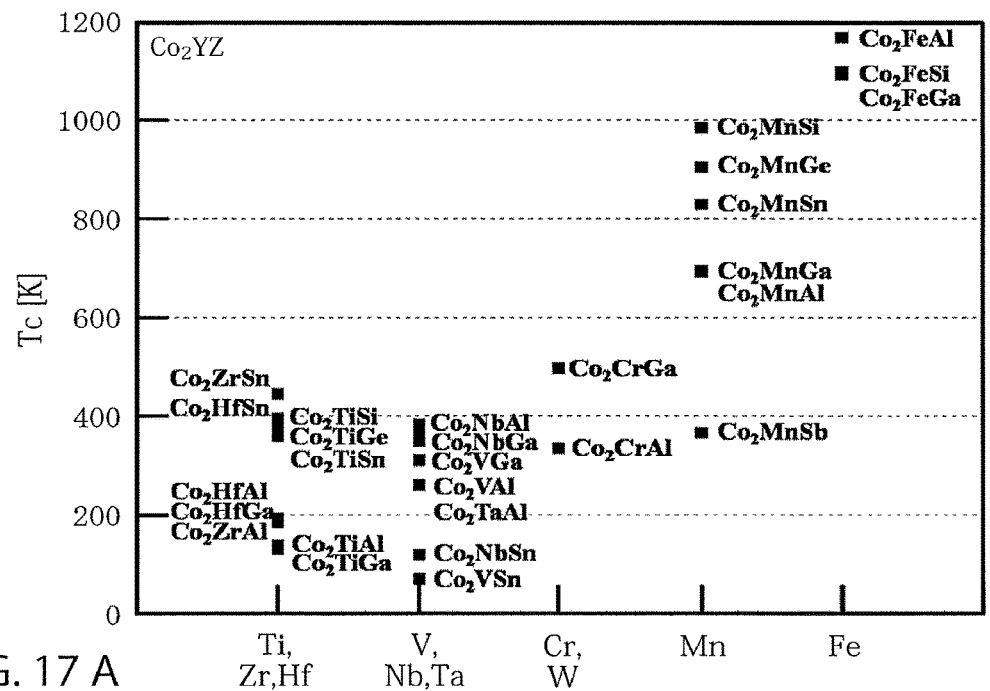
FIGS. 17A to 17C are diagrams showing Tc characteristics of full Heusler alloys.
Figure 17B:
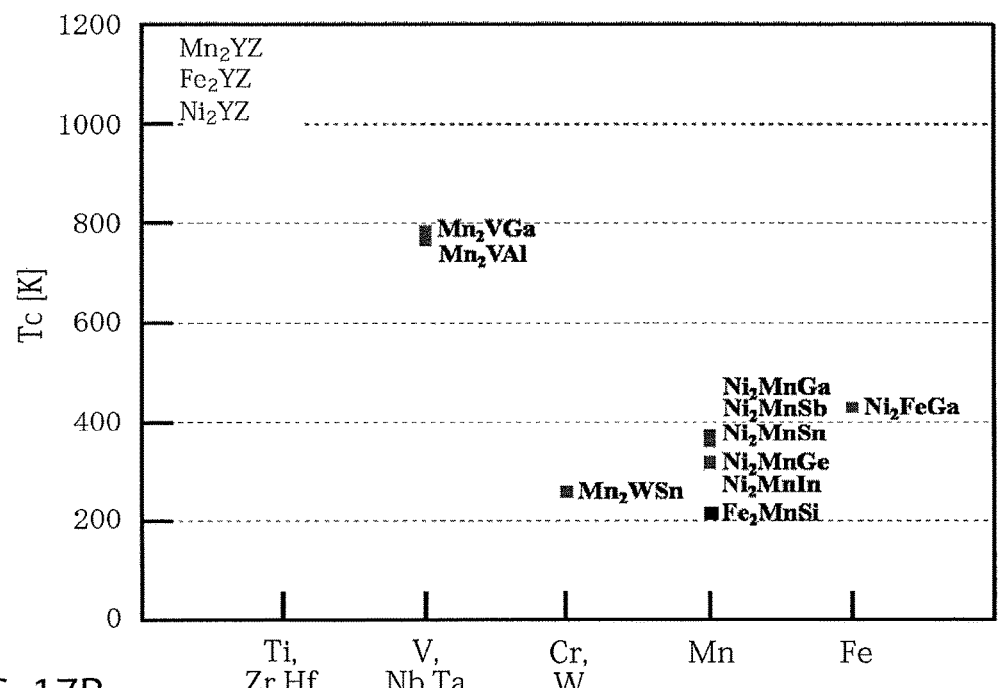
Figure 17C:
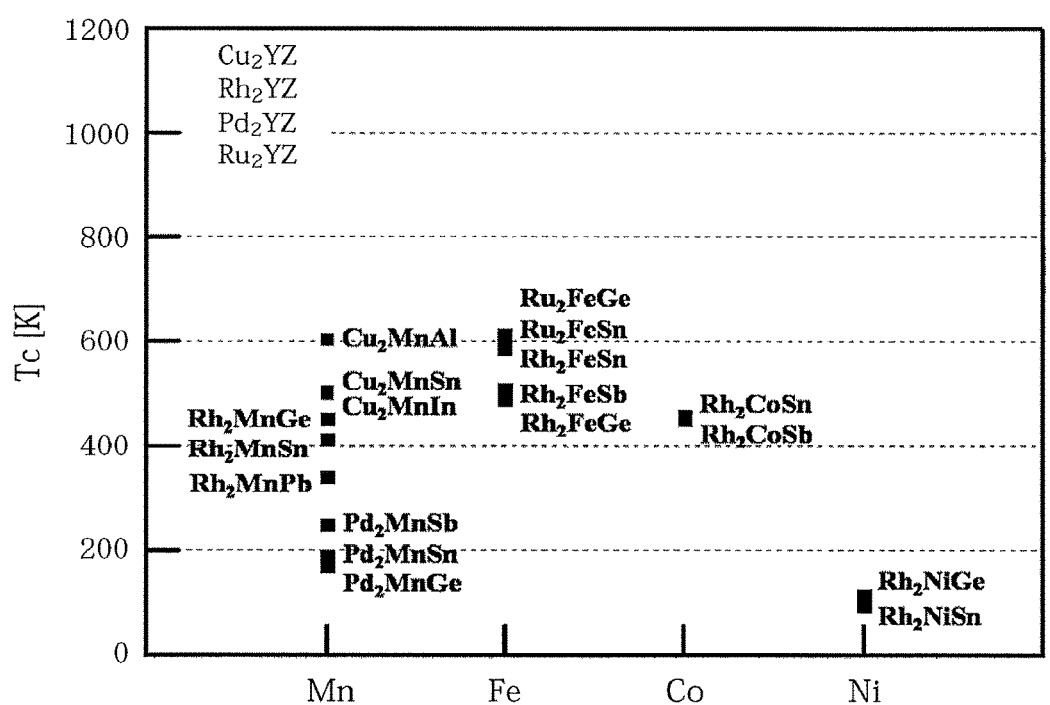

Full Heusler alloys will first be described in the viewpoint of Curie temperature Tc. In actual magnetic memories, the Curie temperature Tc of the magnetic films is preferably equal to or greater than 400 K. FIGS. 17A to 17C show Curie temperature (Tc) characteristics of full Heusler alloys. FIG. 17A shows Tc characteristics of Co-based full Heusler alloys, FIG. 17B shows those of Mn-based, Fe-based, and Ni-based full Heusler allows, and FIG. 17C shows those of Cu-based, Rh-based, Ru-based, and Pd-based full Heusler alloys. The elements on the abscissa axis correspond to "Y" of the composition formula $X_2YZ$. Examples of materials in which Tc>400K are $Co_2YZ$ (where Y represents at least one element selected from the group consisting of Cr, Mn, and Fe, and Z represents at least one element selected from the group consisting of Ga, Si, Ge, Sn, and Al), $Mn_2VZ$ (where Z represents at least one element selected from the group consisting of Al and Ga), $Ni_2FeGa$, $Cu_2MnZ$ (where Z represents at least one element selected from the group consisting of Al, Sn, and In), $Ru_2FeZ$ (where Z represents at least one element selected from the group consisting of Ge and Sn), and $Rh_2YZ$ (where Y represents at least one element selected from the group consisting of Mn, Fe, and Co, and Z represents at least one element selected from the group consisting of Ge, Sb, and Sn).

Figure 18A:
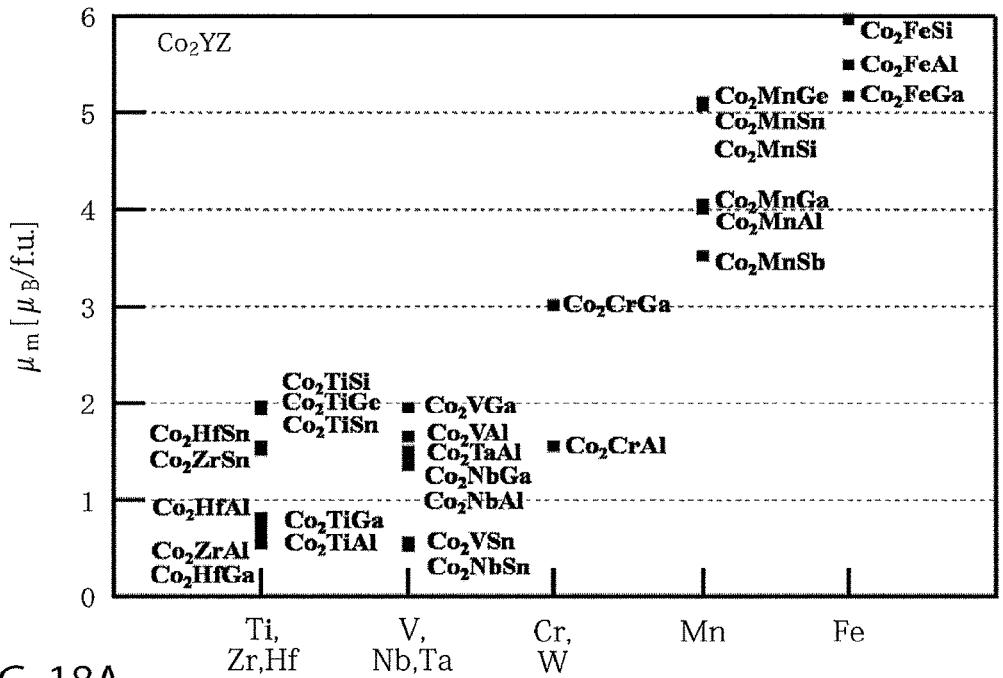
FIGS. 18A to 18C are diagrams showing magnetic moments of full Heusler alloys.
Figure 18B:
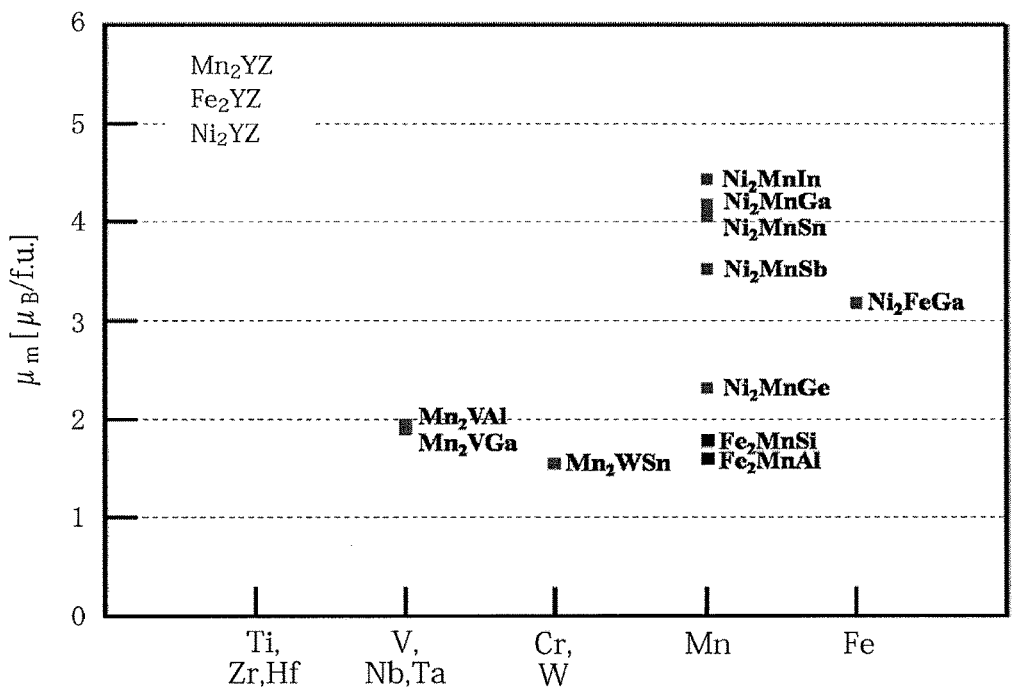
Figure 18C:
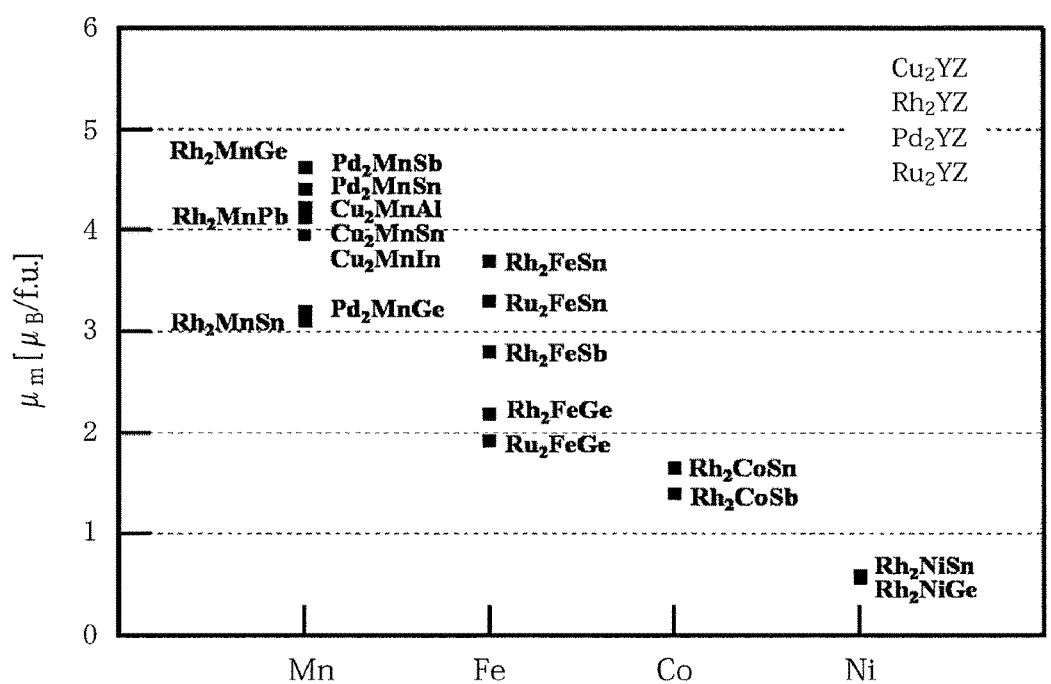

The second viewpoint is the magnetic moment $\mu_B$. FIGS. 18A to 18C show the magnetic moment ($\mu_B$) characteristics of full Heusler alloys. FIG. 18A shows the magnetic moment characteristics of Co-cased full Heusler alloys, FIG. 18B shows those of Mn-based, Fe-based, and Ni-based full Heusler alloys, and FIG. 18C shows those of Cu-based, Rh-based, Ru-based, and Pd-based full Heusler alloys. The elements on the abscissa axis correspond to "Y" of the composition formula $X_2YZ$. Depending on the role of each interfacial magnetic layer, a suitable region of the magnetic moment is present. If a full Heusler alloy is applied to the interfacial magnetic layer 3, the saturation magnetization is preferably as low as possible in order to achieve magnetization switching with a low electric current in the interfacial magnetic layer on the storage layer side. From this viewpoint, examples of the material in which $\mu \leq 2$ include $Co_2HfZ$ (where Z represents at least one element selected from the group consisting of Sn, Al, and Ga), $Co_2ZrZ$ (where Z represents at least one element selected from the group consisting of Sn and Al), $Co_2TiZ$ (where Z represents at least one element selected from the group consisting of Si, Ge, Sn, Ga, and Al), $Co_2YZ$ (where Y represents at least one element selected from the group consisting of V and Nb, and Z represents at least one element selected from the group consisting of Ga, Al, and Sn), $Co_2TaAl$, $Co_2CrAl$, $Mn_2VZ$ (where Z represents at least one element selected from the group consisting of Al and Ga), $Mn_2WSn$, $Fe_2MnZ$ (where Z represents at least one element selected from the group consisting of Si and Al), $Ru_2FeGe$, $Rh_2CoZ$ (where Z represents at least one element selected from the group consisting of Sn and Sb), and $Rh_2NiZ$ (where Z represents at least one element selected from the group consisting of Sn and Ge).

In order to achieve the magnetization switching with a low electric current, microwave-assisted switching may be effective. In order to switch the magnetization with a low electric current using the microwave-assisted switching, a reduction of resonant frequency is required. The resonance frequency may be reduced by disposing an interfacial magnetic layer 3 with a high saturation magnetization adjacent to the storage layer. If the magnetization of the interfacial magnetic layer is too high, however, the influence of the strayed magnetic field to adjacent MTJ elements reaches a level that cannot be ignored. Thus, there is an appropriate range of magnetization, which is preferably about $4 \leq \mu_B \leq 6$. From this viewpoint, examples of materials in which $4 \leq \mu_B \leq 6$ include $Co_2MnZ$ (where Z represents at least one element selected from the group consisting of Ge, Sn, Si, Ga, and Al), $Co_2FeZ$ (where Z represents at least one element selected from the group consisting of Si, Al, and Ga), $Ni_2MnZ$ (where Z represents at least one element selected from the group consisting of In, Ga, and Sn), $Rh_2MnZ$ (where Z represents at least one element selected from the group consisting of Ge and Pb), $Pd_2MnZ$ (where Z represents at least one element selected from the group consisting of Sb and Sn), and $Cu_2MnZ$ (where Z represents at least one element selected from the group consisting of Al, Sn, and In).

If a full Heusler alloy is used to form the interfacial magnetic layer 6, the saturation magnetization is preferably as low as possible in order to suppress the strayed magnetic field to the storage layer from the interfacial magnetic layer on the reference layer side. From this viewpoint, examples of the material in which $\mu_B \leq 2$ includes $Co_2HfZ$ (where Z represents at least one element selected from the group consisting of Sn, Al, and Ga), $Co_2ZrZ$ (where Z represents at least one element selected from the group consisting of Sn and Al), $Co_2TiZ$ (where Z represents at least one element selected from the group consisting of Si, Ge, Sn, Ga, and Al), $Co_2YZ$ (where Y represents at least one element selected from the group consisting of V and Nb, and Z represents at least one element selected from the group consisting of Ga, Al, and Sn), $Co_2TaAl$, $Co_2CrAl$, $Mn_2VZ$ (where Z represents at least one element selected from the group consisting of Al and Ga), $Mn_2WSn$, $Fe_2MnZ$ (where Z represents at least one element selected from the group consisting of Si and Al), $Ru_2FeGe$, $Rh_2CoZ$ (where Z represents at least one element selected from the group consisting of Sn and Sb), and $Rh_2NiZ$ (where Z represents at least one element selected from the group consisting of Sn and Ge).

Figure 19A:
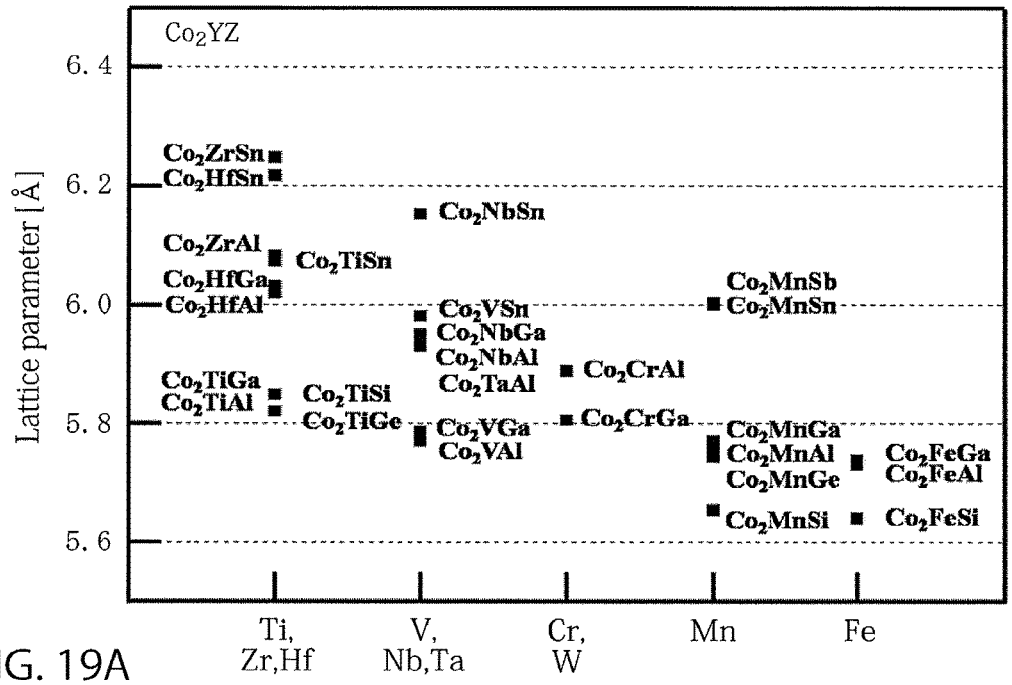
FIGS. 19A to 19C are diagrams showing lattice constants of full Heusler alloys.
Figure 19B:
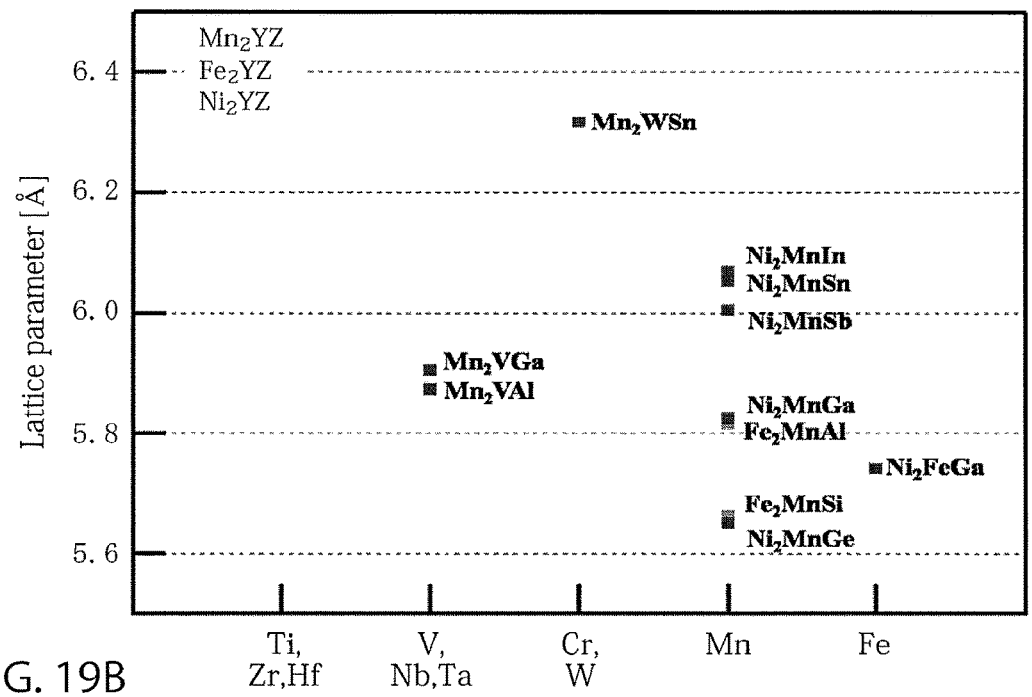
Figure 19C:
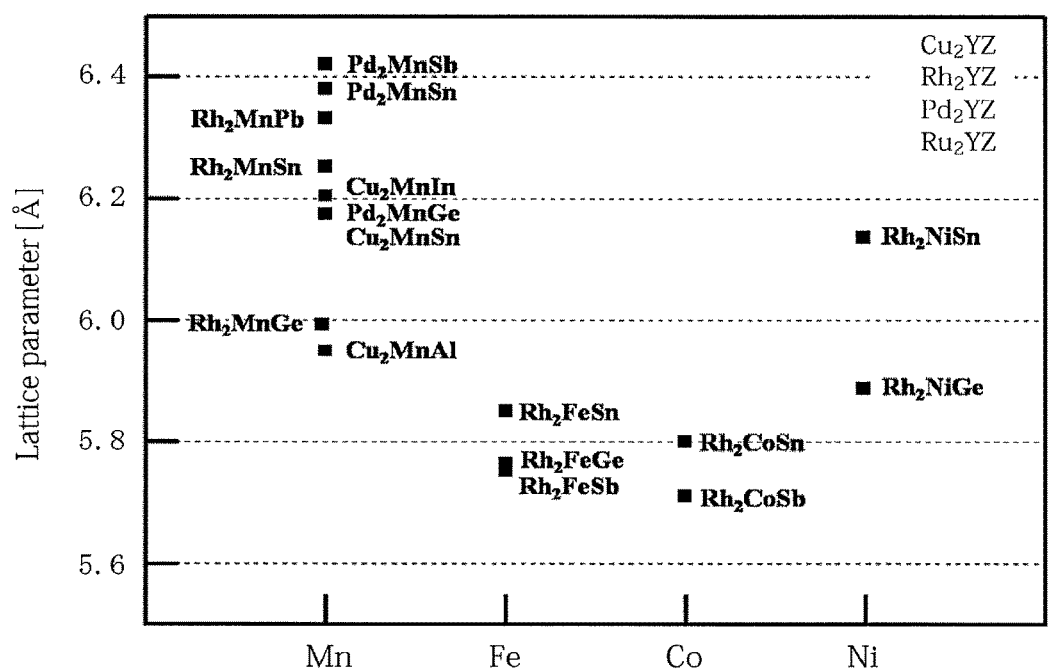

The third viewpoint is the lattice constant a. FIGS. 19A to 19C show the lattice constants of full Heusler alloys. FIG. 19A shows the lattice constants of Co-based full Heusler alloys, FIG. 19B shows those of Mn-based, Fe-based, and Ni-based full Heusler alloys, and FIG. 19C shows those of Cu-based, Rh-based, Ru-based, and Pd-based full Heusler alloys. The elements on the abscissa axis correspond to "Y" of the composition formula $X_2YZ$. The interfacial magnetic layer 3 is preferably disposed between the ferromagnetic layer 2 and the nonmagnetic layer 4 and has an epitaxial relationship with these layers, and the interfacial magnetic layer 6 is preferably disposed between the nonmagnetic layer 4 and the ferromagnetic layer 8 and has an epitaxial relationship with these layers. Such an arrangement may allow an ideal interface with fewer dislocations to be formed, thereby improving the wave number selection of the tunneling electrons. As a result, a high MR ratio may be obtained. Specifically, the lattice constant of the material of the interfacial magnetic layer 3 is preferably between the lattice constant of the material of the ferromagnetic layer 2 and the lattice constant of the material of the nonmagnetic layer 4, and the lattice constant of the material of the interfacial magnetic layer 6 is preferably between the lattice constant of the material of the nonmagnetic layer 4 and the lattice constant of the material of the ferromagnetic layer 8.

More specifically, MnGa, for example, is selected to form the ferromagnetic layer 2 and the ferromagnetic layer 8, and MgO is selected to form the nonmagnetic layer 4. In this case, the lattice constant (a-axis) of MnGa is 3.91 Å, and $\sqrt{}$a is 5.53 Å. The a-axis of MgO is 4.22 Å, and $\sqrt{}$a is 5.97 Å. Therefore, the lattice constant of an interfacial magnetic layer of a Heusler alloy disposed between an MgO barrier layer and a MnGa magnetic layer is preferably about between 5.5 Å and 6.0 Å in order to obtain an epitaxial relationship. In this case, the interfacial magnetic layer serves as a lattice buffer layer. The Heusler layer, the magnetic layer, and the nonmagnetic layer are epitaxially grown with a rotation of 45 degrees in the plane. Examples of such materials with the lattice constant of 5.5 Å to 6.0 Å include $Co_2TiZ$ (where Z represents at least one element selected from the group consisting of Ga, Al, Si, and Ge), $Co_2VZ$ (where Z represents at least one element selected from the group consisting of Sn, Ga, and Al), $Co_2NbZ$ (where Z represents at least one element selected from the group consisting of Ga and Al), $Co_2TaAl$, $Co_2CrZ$ (where Z represents at least one element selected from the group consisting of Al and Ga), $Co_2MnZ$ (where Z represents at least one element selected from the group consisting of Ga, Ge, Al, and Si), $Co_2FeZ$ (where Z represents at least one element selected from the group consisting of Ga, Al, and Si), $Mn_2VZ$ (where Z represents at least one element selected from the group consisting of Al and Ga), $Ni_2MnZ$ (where Z represents at least one element selected from the group consisting of Ga and Ge), $Fe_2MnZ$ (where Z represents at least one element selected from the group consisting of Al and Si), $Ni_2FeGa$, $Rh_2MnGe$, $Cu_2MnAl$, $Rh_2FeZ$ (where Z represents at least one element selected from the group consisting of Sn, Sb, and Ge), $Rh_2CoZ$ (where Z represents at least one element selected from the group consisting of Sn and Sb), and $Rh_2NiGe$.

The full Heusler alloys $X_2YZ$ which are especially suitable for forming interfacial magnetic layers of the first to fifth embodiments and their modifications from the viewpoints of the Curie temperature Tc, the magnetic moment $\mu_B$, and the lattice constant a will be described below. If the interfacial magnetic layers on the storage layer side and the reference layer side need to have low saturation magnetization, such materials as $Mn_2VZ$ (where Z represents at least one element selected from the group consisting of Al and Ga), $Ru_2FeGe$, and $Rh_2CoZ$ (where Z represents at least one element selected from the group consisting of Sn and Sb) are especially suitable for forming the interfacial magnetic layer 3 and the interfacial magnetic layer 6. If the full Heusler alloys are used to form the interfacial magnetic layer on the storage layer side by the microwave-assisted switching, $Co_2YZ$ (where Y represents at least one element selected from the group consisting of Fe and Mn, and Z represents at least one element selected from the group consisting of Al, Si, Ga, Ge, and Sn) is especially suitable.

(Control of Lattice Constant and Saturation Magnetization by Adding Fourth Element or Replacing Third Element with Fourth Element)

If two of the three constituent elements of one of the aforementioned Heusler alloys match those of another, the different constituent element of the former may be added to the latter, or replaced with the different constituent element of the latter. If both materials have a high Curie temperature Tc of more than 400K, the saturation magnetization and the lattice constant may be controlled to have higher values with the high Curie temperature Tc being maintained.

A first specific example is a Heusler alloy $X1_2Y1Z1$ and a Heusler alloy $X2_2Y2Z2$. If Y1 is the same element as Y2, and Z1 is the same element as Z2, the element X1 may be effectively replaced by the element X2. An example is an interfacial magnetic layer of a Heusler alloy $Co_2YZ$ (where Y represents at least one element selected from the group consisting of Fe and Mn, and Z represents at least one element selected from the group consisting of Al, Si, Ga, Ge, and Sn), to which Fe, Cu, Rh, or Ru is added. Since Cu, Rh, and Ru are nonmagnetic elements, if Co of $Co_2YZ$ is replaced with one of these elements, the saturation magnetization may be reduced. Such a material is expressed as $(Co, X)_2YZ$ (where X represents at least one element selected from the group consisting of Cu, Rh, and Ru, Y represents at least one element selected from the group consisting of Fe and Mn, and Z represents at least one element selected from the group consisting of Al, Si, Ga, Ge, and Sn). If the amount of Co replaced by the nonmagnetic element such as Cu, Rh, and Ru is too much, the Curie temperature Tc may be considerably lowered. From this viewpoint, the replacement amount for Co is preferably in the range of $0<X\leq30$ atm %.

Another example is an interfacial magnetic layer containing $Mn_2VZ$ (where Z represents at least one element selected from the group consisting of Al and Ga), to which at least one element selected from the group consisting of Co, Fe, Cu, Rh, and Ru is added. This material is expressed as $(Mn, X)_2VZ$ (where X represents at least one element selected from the group consisting of Co, Fe, Cu, Rh, and Ru, and Z represents at least one element selected from the group consisting of Al and Ga). Since Cu, Rh, and Ru are nonmagnetic elements, if Mn of $Mn_2VZ$ is replaced with at least one of these elements, the saturation magnetization may be reduced. Although Co and Fe are magnetic elements, according to the first principles calculation, if Mn is replaced with at least one of these elements, the saturation magnetization may be reduced with the high spin polarization being maintained. Therefore, these elements are suitably added to the interfacial magnetic layer 6 which requires a low saturation magnetization. If a too much amount of the nonmagnetic element such as Cu, Rh, and Ru or the magnetic element such as Co and Fe is added, the Curie temperature Tc may be considerably lowered. From this viewpoint, the replacement amount for Mn is preferably in the range of $0<X\leq30$ atm %.

A second specific example is a Heusler alloy $X1_2Y1Z1$ and a Heusler alloy $X2_2Y2Z2$ which have a Curie temperature Tc or more than 400K. If X1 is the same element as X2, and Y1 is the same element as Y2, the element Z2 may be effectively added to $X1_2Y1Z1$, or the element Z1 may be effectively replaced by the element Z2. For example, Al and Ga in the Z part of $Mn_2VZ$ (where Z represents at least one element selected from the group consisting of Al and Ga) may be partially and mutually replaced by each other effectively. The lattice constant of $Mn_2V(Al_{1-x}Ga_x)$ may be controlled with a high Curie temperature Tc and a low magnetic moment being maintained.

Another example is $Rh_2CoZ$ (where Z represents at least one element selected from the group consisting of Sn and Sb), in which Sn and Sb in Z part may be partially and mutually substituted by each other effectively. Specifically, the magnetic moment and the lattice constant of $Rh_2Co(Sn_{1-x}Sb_x)$ may be controlled with a high Curie temperature Tc being maintained.

A third specific example is a Heusler alloy $X1_2Y1Z1$ and a Heusler alloy $X2_2Y2Z2$. If X1 is the same element as X2 and Z1 is the same element as Z2, the element Y2 may be effectively added to $X1_2Y1Z1$, or the element Y1 may be effectively replaced by the element Y2. An example of this case is $Co_2YZ$ (where Y represents at least one element selected from the group consisting of Fe and Mn, and Z represents at least one element selected from the group consisting of Al, Si, Ga, Ge, and Sn), to which at least one of Ti, V, and Nb is added. Such an alloy may be expressed as $Co_2(Y1, Y2)Z$ (where Y1 represents at least one element selected from the group consisting of Fe and Mn, and Y2 represents at least one element selected from the group consisting of Ti, V, and Nb, and Z represents at least one element selected from the group consisting of Al, Si, Ga, Ge, and Sn). Since Ti, V, and Nb are nonmagnetic elements, a low saturation magnetization may be effectively achieved with these elements. However, if too much amount of a nonmagnetic element such as Ti, V, and Nb is added, the Curie temperature Tc may be considerably lowered. From this viewpoint, the replacement amount is preferably in the range of $0<Y2\leq30$ atm %.

(Half Heusler XYZ)

Examples of half Heusler alloys XYZ that meet all of the aforementioned requirements from the aforementioned viewpoints for forming an interfacial magnetic layer include NiMnSb, CoMnSb, and their complexes (Ni, Co)MnSb. Since these materials have a great saturation magnetization, they are particularly suitable to form an interfacial magnetic layer on the storage layer side, i.e., the interfacial magnetic layer 3.

(Combination of Materials of Interfacial Magnetic Layer and Ferromagnetic Layer)

If the aforementioned materials are used to form the interfacial magnetic layer 3 and the interfacial magnetic layer 6, a magnetoresistive element with high MR ratio, including magnetic layers and interfacial magnetic layers with low saturation magnetization, low Gilbert damping factor, and high perpendicular magnetic anisotropy may be obtained. The manufacturing of the magnetoresistive element, however, requires several heat treatments. On such occasions, a part of a magnetic layer and a part of an interfacial magnetic layer may be mixed due to element diffusion. If a multilayer structure includes, for example, a ferromagnetic layer containing Mn and at least one element selected from the group consisting of Al, Ge, and Ga, and an interfacial magnetic layer containing one of the aforementioned Heusler alloys, depending on the constituent elements of the Heusler alloy, the addition of an element such as Mn, Al, Ge, and Ga may cause the Heusler alloy to lose the desired crystal structure, electric characteristics, and magnetic characteristics. Therefore, the combination of the materials of the ferromagnetic layer and the interfacial magnetic layer is important. Specifically, the constituent elements of the Heusler alloy are preferably of the same kind as the elements of the ferromagnetic layer. This may prevents these layers from being greatly affected by composition modulation caused by the element diffusion. Specific examples of the material of an interfacial magnetic layer that are in a good compatibility relationship with a ferromagnetic layer containing Mn and at least one element selected from the group consisting of Al, Ge, and Ga include $Mn_2VZ$ (where Z represents at least one element selected from the group consisting of Al and Ga), $Mn_2YZ$ (where Y represents at least one element selected from the group consisting of Ru, Cr, and Co, and Z represents at least one element selected from the group consisting of Al, Ga, and Ge), $(Co, X)_2MnZ$ (where X represents at least one element selected from the group consisting of Cu, Rh, and Ru, and Z represents at least one element selected from the group consisting of Al, Ga, and Ge), $Co_2(Mn, Y)Z$ (where Y represents at least one element selected from the group consisting of Ti, V, and Nb, and Z represents at least one element selected from the group consisting of Al, Ga, and Ge).

It may also be effective if a function layer serving as a diffusion prevention layer is disposed between the ferromagnetic layer and the interfacial magnetic layer. The details for this will be described later.

(Film Thickness Range)

Figure 20A:
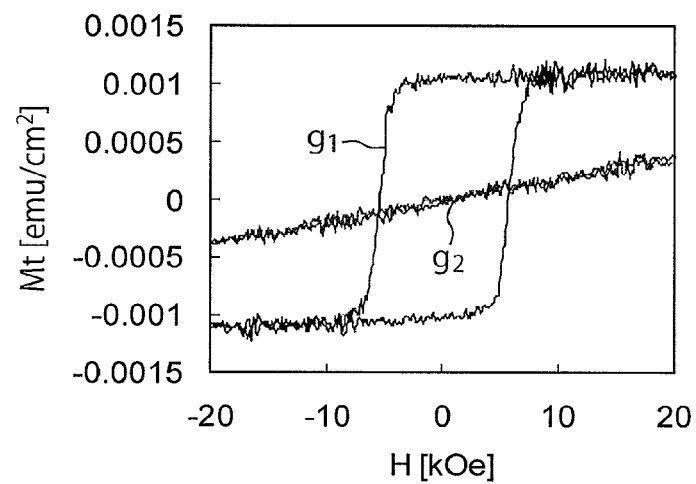
FIGS. 20A and 20B are diagrams showing examples of magnetization curves of $Co_2MnAl$/MnGa multilayer structures.
Figure 20B:
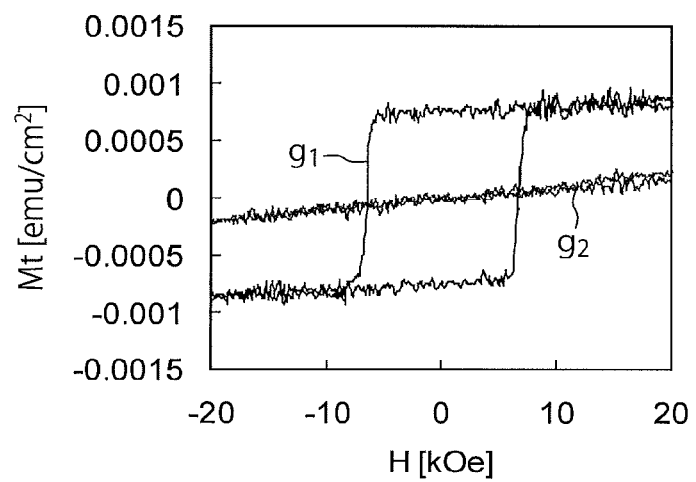

As described above, growing as a monolayer film, a Heusler alloy has magnetic characteristics in an in-plane magnetization direction (see FIGS. 2A to 3C). The inventors have found that if a Heusler alloy interfacial magnetic layer is disposed to be adjacent to and magnetically coupled with a magnetic film containing a material that has strong perpendicular magnetic anisotropy, for example a material containing Mn and at least one element selected from the group consisting of Al, Ge, and Ga, the Heusler alloy interfacial magnetic layer functions as a perpendicular magnetization film. FIGS. 20A and 20B show examples of magnetization curves of $Co_2MnAl/MnGa$ multilayer structures. FIG. 20A shows a $Co_2MnAl/MnGa$ multilayer structure in which the $Co_2MnAl$ layer has a thickness of 1.5 nm, and FIG. 20B shows a $Co_2MnAl/MnGa$ multilayer structure in which the $Co_2MnAl$ layer has a thickness of 5 nm. The magnetization curve $g_1$ in FIGS. 20A and 20B represents a case where an external magnetic field is perpendicularly applied to the film plane, and the magnetization curve $g_2$ represents a case where an external magnetic field is applied in parallel to the film plane. As can be understood from FIGS. 20A and 20B, the $Co_2MnAl/MnGa$ multilayer structures show good perpendicular magnetic characteristics in both cases. Although the thicknesses of the $Co_2MnAl$ layers shown in FIGS. 20A and 20B are the same as those shown in FIGS. 2A to 3C, the layers shown in FIGS. 20A and 20B have perpendicular magnetization. The reason for this is considered to be magnetic coupling of these layers with the magnetic layers having strong perpendicular magnetic anisotropy. What is more remarkable is that the upper limit of the thickness of the $Co_2MnAl$ layer for obtaining the perpendicular magnetization is at least 5 nm or more, which is considerably greater than the 1-nm upper limit of a layer to have perpendicular magnetization by interfacial magnetic anisotropy. This result may lead to a high TMR ratio that is equivalent to the TMR ratio obtained in an in-phase MTJ element including the magnetic layer of one of the Heusler alloys shown in FIG. 4. According to the aforementioned experiment, the thicknesses of the interfacial magnetic layer 3 and the interfacial magnetic layer 6 are preferably in the range of 1.5 nm to 5 nm.

(Interfacial Magnetic Layer of Material Other than Heusler Alloys)

As described in the descriptions of the first to fifth embodiments, the interfacial magnetic layer 3 and the interfacial magnetic layer 6 preferably contain the aforementioned Heusler alloys. However, if a Heusler alloy is used to form one of the interfacial magnetic layers that is in contact with a magnetic layer containing Mn and at least one element selected from the group consisting of Al, Ge, and Ga of, for example, the third embodiment, the other interfacial magnetic layer may be formed of any of the materials described below to have the same effect. Hereinafter, materials that can be effectively used to form the other interfacial magnetic layer in combination with a Heusler alloy interfacial magnetic layer to obtain a satisfactory result will be described.

A first specific example of the material of the interfacial magnetic layer 3 or the interfacial magnetic layer 6 is a MnGa alloy. From the viewpoint of the control of saturation magnetization, perpendicular magnetic anisotropy, Gilbert damping factor, and spin polarization, at least one element selected from the group consisting of Al, Ge, Ir, Cr, Co, Pt, Ru, Pd, Rh, Ni, Fe, Re, Au, Cu, B, C, P, Gd, Tb, and Dy may also be added to the MnGa alloy. Thus, MnGaX, which contains Mn, Ga, and at least one element selected from the group consisting of Al, Ge, Ir, Cr, Co, Pt, Ru, Pd, Rh, Ni, Fe, Re, Au, Cu, B, C, P, Gd, Tb, and Dy may be employed. Specific examples of such a material include MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

A second specific example of the material of the interfacial magnetic layer 3 or the interfacial magnetic layer 6 is a MnGe alloy. A MnGe alloy has an energy gap in the (001) direction with respect to either of the up-spin or down-spin band, and therefore has a half-metallic characteristic and a high spin polarization. Therefore, the MnGe alloy may have a high MR ratio.

A third specific example of the material of the interfacial magnetic layer 3 or the interfacial magnetic layer 6 is an alloy containing an element selected from the group consisting of Mn, Fe, Co, and Ni, and two elements selected from the group consisting of Zn, Al, Ga, In, Si, Ge, Sn, As, Sb, and Bi. Specific examples include MnAlGe or MnZnSb.

A fourth specific example of the material of the interfacial magnetic layer 3 or the interfacial magnetic layer 6 is a MnAl alloy. A MnAl alloy has an energy gap in the (001) direction with respect to either of the up-spin or down-spin band, and therefore has a half-metallic characteristic and a high spin polarization. Therefore, the MnAl alloy may have a high MR ratio.

The aforementioned materials, MnGa, MnGaX (where X represents at least one element selected from the group consisting of Al, Ge, Ir, Cr, Co, Pt, Ru, Pd, Rh, Ni, Fe, Re, Au, Cu, B, C, P, Gd, Tb, and Dy), MnGe, MnAlGe, MnZnSb, and MnAl have characteristics to serve as a magnetization film if they have appropriate composition ranges. In order to have the perpendicular magnetic anisotropy, the c-axis of these materials should be oriented in the direction perpendicular to the film plane, i.e., the (001) direction. Specifically, the crystal orientation of the interfacial magnetic layer 3 may be controlled by appropriately selecting the materials of the base layer 100 and the ferromagnetic layer 2, and the crystal orientation of the interfacial magnetic layer 6 may be controlled by appropriately selecting the material of the nonmagnetic layer 4.

If a multilayer structure includes, for example, a ferromagnetic layer 2 of MnGa, an interfacial magnetic layer 3 of $Mn_2VAl$, a nonmagnetic layer 4 of MgO, and an interfacial magnetic layer 6 of MnGe stacked in this order, the crystal orientation of MnGe(001)/MgO(001)/$Mn_2VAl$(001)/MnGa (001) may be obtained. For example, MnGe(001) means that the crystal of MnGe is oriented so that the (001) surface is exposed on the top surface. This improves the wave number selection of tunneling electrons, and therefore leads to a greater MR ratio. Thus, a high MR ratio magnetoresistive element including magnetic layers and interfacial magnetic layers with low saturation magnetization, low Gilbert damping factor, and high perpendicular magnetic anisotropy may be obtained.

A fifth specific example of the material of the interfacial magnetic layer 3 or the interfacial magnetic layer 6 is an alloy containing a metal selected from the group consisting of Fe and Co. In order to control the saturation magnetization and the interfacial magnetic layer 3 or the interfacial magnetic layer 6, at least one element selected from the group consisting of Ni, B, C, P, Ta, Ti, Mo, Si, W, Nb, Mn, and Ge may be added to the interfacial magnetic layer 3 or the interfacial magnetic layer 6. In other words, the interfacial magnetic layer 3 or the interfacial magnetic layer 6 may be formed of an alloy containing at least one element selected from the group consisting of Fe and Co, and at least one element selected from the group consisting of Ni, B, C, P, Ta, Ti, Mo, Si, W, Nb, Mn, and Ge. Examples of such an alloy other than CoFeB include CoFeSi, CoFeP, CoFeW, and CoFeNb. These alloys have spin polarization equivalent to that of CoFeB.

If a multilayer structure includes, for example, a ferromagnetic layer 2 of MnGa, an interfacial magnetic layer 3 of $Mn_2VAl$, a nonmagnetic layer 4 of MgO, and an interfacial magnetic layer 6 of CoFe(B) stacked in this order, the crystal orientation of CoFe(B)(001)/MgO(001)/$Mn_2VAl$(001)/MnGa(001) may be obtained. CoFe(B) means a ferromagnetic layer that may contain B besides Co and Fe. MgO (001), for example, means that the crystal of MgO is oriented so that the (001) surface is exposed on the top surface. This improves the wave number selection of tunneling electrons, and therefore leads to a higher MR ratio. Thus, a high MR ratio magnetoresistive element including magnetic layers and interfacial magnetic layers with low saturation magnetization, low Gilbert damping factor, and high perpendicular magnetic anisotropy may be obtained.

Generally, there is a correlation between the Gilbert damping factor and the magnitude of spin orbit interaction of a material. A material having a higher atomic number has greater spin orbit interaction, and a higher Gilbert damping factor. Since the materials of the interfacial magnetic layers of the first to fifth specific examples are formed of light elements, the Gilbert damping factor of these materials is low. Therefore, the current density for magnetization switching by spin-polarized electrons can be considerably reduced since the energy required for magnetization switching is low. Accordingly, such materials may be effectively used to form the interfacial magnetic layer 3 and the interfacial magnetic layer 6.

Since a high MR ratio may be obtained as long as the interfacial magnetic layer 3 or the interfacial magnetic layer 6 is epitaxially grown relative to the nonmagnetic layer 4, the thickness of the interfacial magnetic layer 3 or the interfacial magnetic layer 6 that is in contact with the nonmagnetic layer 4 may be increased or decreased in the direction perpendicular to the film plane.

(Function Layer 5 and Function Layer 7)

The function layer 5 and the function layer 7 are preferably formed of a nonmagnetic material. Specific descriptions are provided below.

A function layer is disposed between a ferromagnetic layer and an interfacial magnetic layer to prevent elements included in materials of these layers from being mixed due to element diffusion. Therefore, the material of the function layer is required to prevent one or more of such elements as Mn, Al, Ge, and Ga contained in the ferromagnetic layer 2 and the ferromagnetic layer 8, which are magnetic layers containing Mn and at least one element selected from the group consisting of Al, Ge, and Ga, from being diffused to the interfacial magnetic layer 3 and the interfacial magnetic layer 6. It can be understood from the binary phase diagram that if the elements of the function layer do not form a solid solution with Mn, Al, Ge, or Ga, or form a complete intermetallic compound, these elements are not easily mixed. Therefore, the function layer has an effect of blocking different kinds of element, and therefore serves as a diffusion prevention layer. The function layer itself is required to be superior in heat resistance, and therefore is preferably formed of a high melting-point material. From this viewpoint, the function layer 5 and the function layer 7 are preferably formed of a nonmagnetic layer containing at least one element selected from the group consisting of Mg, Ba, Ca, Sr, Sc, Y, Nb, Gd, Tb, Dy, Ce, Ho, Yb, Er, B, C, and N. In order to achieve a high melting point, the function layers may be formed of a compound containing at least one of these elements. Specific examples include borides, carbides, and nitrides. The function layers may also have a multilayer structure including layers of the aforementioned elements.

The ferromagnetic layer 2 and the interfacial magnetic layer 3 are preferably magnetically coupled with each other, and the ferromagnetic layer 8 and the interfacial magnetic layer 6 are preferably magnetically coupled with each other. Therefore, the thickness of the function layers has an upper limit. According to the study of the inventors, the thickness of the function layers is preferably equal to or more than the thickness at which they serve as diffusion prevention layers, and equal to or less than the thickness at which the magnetic coupling is cut. Therefore, the thickness of the function layers is preferably in the range of 0.3 nm to 1.5 nm.

Sixth Embodiment

A magnetic memory (MRAM) of spin transfer torque writing type according to a sixth embodiment will be described below.

Figure 21:
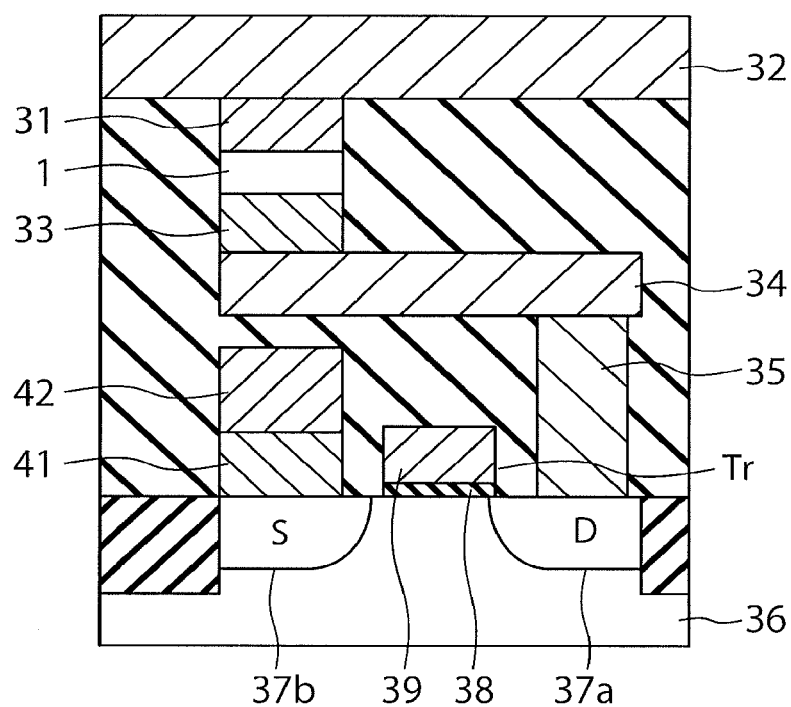
FIG. 21 is a cross-sectional view illustrating a memory cell of a magnetic memory according to a sixth embodiment.

The MRAM according to the sixth embodiment includes a plurality of memory cells. FIG. 21 is a sectional view of a main part of a memory cell of the MRAM according to the sixth embodiment. Each memory cell includes a magnetoresistive element according to any of the first to fifth embodiments and their modifications as a storage element. In the descriptions of the sixth embodiment, the storage element is the magnetoresistive element (MTJ element) according to the first embodiment.

As shown in FIG. 21, the top surface of the MTJ element is connected to a bit line 32 via an upper electrode 31. The lower surface of the MTJ element is connected, via a lower electrode 33, an extraction electrode 34, and a plug 35, to a drain region 37a of the source/drain regions formed near the surface of a semiconductor substrate 36. The drain region 37a constitutes a selection transistor Tr with the source region 37b, a gate insulating film 38 disposed on the substrate 36, and a gate electrode 39 disposed on the gate insulating film 38. The selection transistor Tr and the MTJ element constitute one memory cell of the MRAM. The source region 37b is connected to another bit line 42 via a plug 41. The extraction electrode 34 may be omitted, and the plug 35 may be disposed under the lower electrode 33 and directly connected to the lower electrode 33. The bit lines 32 and 42, the electrodes 31 and 33, the extraction electrode 34, and the plugs 35 and 41 are formed of such materials as W, Al, AlCu, and Cu.

Figure 22:
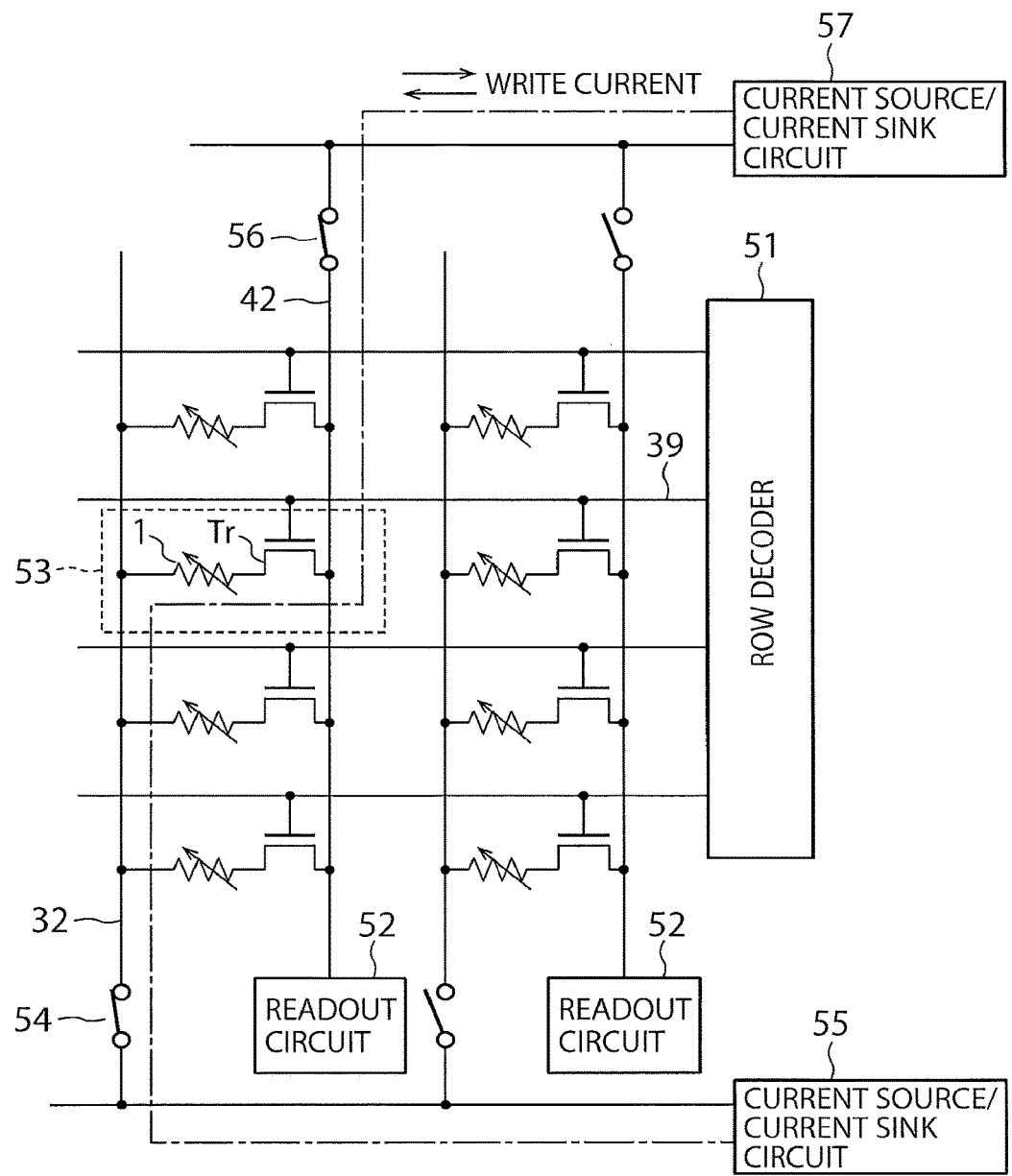
FIG. 22 is a circuit diagram of a main part of the magnetic memory according to the sixth embodiment.

In the MRAM according to the sixth embodiment, a plurality of memory cells, each being the one shown in FIG. 21, are arranged in a matrix to form a memory cell array of the MRAM. FIG. 22 is a circuit diagram showing the MRAM according to the sixth embodiment.

FIG. 22 shows that a plurality of memory cells 53 each including an MTJ element and a selection transistor Tr are arranged in a matrix form. A first terminal of each of the memory cells 53 in the same column is connected to the same bit line 32, and a second terminal is connected to the same bit line 42. The gate electrodes (word line) 39 of the selection transistors Tr of the memory cells 53 in the same row are mutually connected, and further connected to a row decoder 51.

The bit line 32 is connected to a current source/current sink circuit 55 via a switch circuit 54 such as a transistor. The bit line 42 is connected to a current source/current sink circuit 57 via a switch circuit 56 such as a transistor. The current source/current sink circuits 55 and 57 supply a write current to the bit lines 32 and 42 connected to them, and extract a current from the bit lines 32 and 42.

The bit line 42 is also connected to a readout circuit 52. The readout circuit 52 may be connected to the bit line 32. The readout circuit 52 includes a read current circuit and a sense amplifier.

In a write operation, a current path passing through a target memory cell is formed by turning on the switch circuits 54 and 56 connected to the target memory cell and the selection transistor Tr. One of the current source/current sink circuits 55 and 57 serves as a current source circuit, and the other serves as a current sink circuit. The roles are determined depending on the information to be written. A write current flows in a direction determined according to the information to be written.

With respect to the write speed, the spin transfer torque writing may be performed with a current having a pulse width of several nanoseconds to several microseconds.

In a read operation, a read current that is low enough to prevent magnetization switching is supplied from a read current circuit to an MTJ element determined in the same manner as the write operation. The readout circuit 52 determines the resistance state of the MR element by comparing, with a reference value, a current value or voltage value derived from the resistance value that depends on the magnetization state of the MTJ element.

The current pulse width in a read operation is preferably narrower than that in a write operation. The occurrence of writing errors caused by a current in a read operation may be reduced in this manner. This is based on the fact that the narrower the pulse width of a write current is, the greater the absolute value of the write current value becomes.

As described above, according to the sixth embodiment, a magnetic memory including a magnetoresistive element with low saturation magnetization, high perpendicular magnetic anisotropy and high MR ratio may be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a first magnetic layer;
a second magnetic layer;
a first nonmagnetic layer disposed between the first magnetic layer and the second magnetic layer; and
a third magnetic layer disposed between the first magnetic layer and the first nonmagnetic layer,
the first magnetic layer containing Mn and at least one of Ge, Ga, or Al, and the third magnetic layer containing $Mn_2V(Al_{1-x}Ga_x)(0<x\leq1)$.

2. The element according to claim 1, wherein the third magnetic layer further contains at least one of Co, Fe, Cu, Rh, or Ru.

3. The element according to claim 1, wherein the third magnetic layer has a thickness of 1.5 nm to 5 nm.

4. The element according to claim 1, wherein the first magnetic layer contains Mn, Ga, and at least one of Al, Ge, Cr, Co, Pt, Ir, Ru, Pd, Rh, Ni, Fe, Re, Au, Cu, B, C, P, Gd, Tb, or Dy.

5. The element according to claim 1, further comprising a second nonmagnetic layer disposed between the first magnetic layer and the third magnetic layer, the second nonmagnetic layer containing at least one of Mg, Ba, Ca, Sr, Sc, Y, Nb, Gd, Tb, Dy, Ce, Ho, Yb, Er, B, C, or N.

6. A magnetoresistive element comprising:
a first magnetic layer;
a second magnetic layer;
a first nonmagnetic layer disposed between the first magnetic layer and the second magnetic layer; and
a third magnetic layer disposed between the first magnetic layer and the first nonmagnetic layer,
the first magnetic layer containing Mn and at least one of Ge, Ga, or Al, and the third magnetic layer containing $Ru_2FeGe$ or $Rh_2CoZ$, where Z represents at least one element of Sn or Sb.

7. The element according to claim 6, wherein the third magnetic layer has a thickness of 1.5 nm to 5 nm.

8. The element according to claim 6, wherein the first magnetic layer contains Mn, Ga, and at least one of Al, Ge, Cr, Co, Pt, Ir, Ru, Pd, Rh, Ni, Fe, Re, Au, Cu, B, C, P, Gd, Tb, or Dy.

9. The element according to claim 6, further comprising a second nonmagnetic layer disposed between the first magnetic layer and the third magnetic layer, the second nonmagnetic layer containing at least one of Mg, Ba, Ca, Sr, Sc, Y, Nb, Gd, Tb, Dy, Ce, Ho, Yb, Er, B, C, or N.

10. A magnetoresistive element comprising:
a first magnetic layer;
a second magnetic layer;
a first nonmagnetic layer disposed between the first magnetic layer and the second magnetic layer; and
a third magnetic layer disposed between the first magnetic layer and the first nonmagnetic layer,
the first magnetic layer containing Mn and at least one of Ge, Ga, or Al, and the third magnetic layer containing $Co_2YZ$ and at least one of Cu, Rh, Ru, Ti, V, or Nb, where Y represents at least one element of Fe or Mn, and Z represents at least one element of Al, Si, Ga, Ge, or Sn.

11. The element according to claim 10, wherein the third magnetic layer has a thickness of 1.5 nm to 5 nm.

12. The element according to claim 10, wherein the first magnetic layer contains Mn, Ga, and at least one of Al, Ge, Cr, Co, Pt, Ir, Ru, Pd, Rh, Ni, Fe, Re, Au, Cu, B, C, P, Gd, Tb, or Dy.

13. The element according to claim 10, further comprising a second nonmagnetic layer disposed between the first magnetic layer and the third magnetic layer, the second nonmagnetic layer containing at least one of Mg, Ba, Ca, Sr, Sc, Y, Nb, Gd, Tb, Dy, Ce, Ho, Yb, Er, B, C, or N.

14. A magnetoresistive element comprising:
a first magnetic layer;
a second magnetic layer;

a first nonmagnetic layer disposed between the first magnetic layer and the second magnetic layer; and a third magnetic layer disposed between the first magnetic layer and the first nonmagnetic layer, the first magnetic layer containing Mn and at least one of Ge, Ga, or Al, and the third magnetic layer containing $Mn_2YZ$, where Y represents at least one element of Ru, Cr, or Co, and Z represents at least one element of Al, Ga, or Ge.

15. The element according to claim 14, wherein the third magnetic layer has a thickness of 1.5 nm to 5 nm.

16. The element according to claim 14, wherein the first magnetic layer contains Mn, Ga, and at least one of Al, Ge, Cr, Co, Pt, Ir, Ru, Pd, Rh, Ni, Fe, Re, Au, Cu, B, C, P, Gd, Tb, or Dy.

17. The element according to claim 14, further comprising a second nonmagnetic layer disposed between the first magnetic layer and the third magnetic layer, the second nonmagnetic layer containing at least one of Mg, Ba, Ca, Sr, Sc, Y, Nb, Gd, Tb, Dy, Ce, Ho, Yb, Er, B, C, or N.

18. A magnetic memory comprising:
the magnetoresistive element according to claim 1;
a first wiring electrically connected to the first magnetic layer of the magnetoresistive element; and
a second wiring electrically connected to the second magnetic layer of the magnetoresistive element.

19. A magnetoresistive element comprising:
a first magnetic layer;
a second magnetic layer;
a first nonmagnetic layer disposed between the first magnetic layer and the second magnetic layer; and
a third magnetic layer disposed between the first magnetic layer and the first nonmagnetic layer,
the first magnetic layer containing Mn and at least one of Ge, Ga, or Al, the third magnetic layer containing $Mn_2VZ$, where V represents vanadium, and Z represents at least one element of Al or Ga, and the third magnetic layer having a magnetization along a c-axis perpendicular to a film plane.

20. The element according to claim 19, wherein the third magnetic layer further contains at least one of Co, Fe, Cu, Rh, or Ru.

21. The element according to claim 19, wherein the third magnetic layer has a thickness of 1.5 nm to 5 nm.

22. The element according to claim 19, wherein the first magnetic layer contains Mn, Ga, and at least one of Al, Ge, Cr, Co, Pt, Ir, Ru, Pd, Rh, Ni, Fe, Re, Au, Cu, B, C, P, Gd, Tb, or Dy.

* * * * *